United States Patent
Wiesbauer et al.

(10) Patent No.: US 11,225,408 B2
(45) Date of Patent: Jan. 18, 2022

(54) SYSTEM AND METHOD FOR A MEMS TRANSDUCER

(71) Applicant: Infineon Technologies AG, Neubiberg (DE)

(72) Inventors: Andreas Wiesbauer, Poertschach (AT); Christian Mandl, Munich (DE); Marc Füldner, Neubiberg (DE); Shu-Ting Hsu, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/744,857

(22) Filed: Jan. 16, 2020

(65) Prior Publication Data
US 2020/0148531 A1 May 14, 2020

Related U.S. Application Data

(62) Division of application No. 14/073,672, filed on Nov. 6, 2013, now Pat. No. 10,589,987.

(51) Int. Cl.
*B81B 7/00* (2006.01)
*H04R 19/00* (2006.01)
(Continued)

(52) U.S. Cl.
CPC .......... *B81B 7/0077* (2013.01); *B81B 3/0021* (2013.01); *B81C 1/00388* (2013.01);
(Continued)

(58) Field of Classification Search
CPC ................ B81B 7/0077; B81B 3/0021; B81B 2201/0257; B81B 2203/0127;
(Continued)

(56) References Cited

U.S. PATENT DOCUMENTS 6,108,415 A 8/2000 Andrea
7,790,492 B1 9/2010 Baumhauer, Jr. et al.
(Continued)

FOREIGN PATENT DOCUMENTS

CN 101321406 A 12/2008
CN 101459866 A * 6/2009
(Continued)

OTHER PUBLICATIONS

Feiertag, G., et al., "Flip chip packaging for MEMS microphones," Microsyst Technol, Feb. 2010, Springer-Verlag, 7 pages.
(Continued)

*Primary Examiner* — Matthew A Eason
*Assistant Examiner* — Kuassi A Ganmavo
(74) *Attorney, Agent, or Firm* — Slater Matsil, LLP

(57) ABSTRACT

An embodiment as described herein includes a microelectromechanical system (MEMS) with a first MEMS transducer element, a second MEMS transducer element, and a semiconductor substrate. The first and second MEMS transducer elements are disposed at a top surface of the semiconductor substrate and the semiconductor substrate includes a shared cavity acoustically coupled to the first and second MEMS transducer elements.

18 Claims, 19 Drawing Sheets

(51) Int. Cl.
| | |
|---|---|
| *H04R 31/00* | (2006.01) |
| *H04R 19/04* | (2006.01) |
| *H04R 1/40* | (2006.01) |
| *B81B 3/00* | (2006.01) |
| *B81C 1/00* | (2006.01) |
| *H04R 1/04* | (2006.01) |
| *H04R 3/00* | (2006.01) |

(52) U.S. Cl.
CPC .......... *B81C 1/00523* (2013.01); *H04R 1/04* (2013.01); *H04R 1/406* (2013.01); *H04R 3/005* (2013.01); *H04R 19/005* (2013.01); *H04R 19/04* (2013.01); *H04R 31/00* (2013.01); *B81B 2201/0257* (2013.01); *B81B 2203/0127* (2013.01); *B81B 2203/0315* (2013.01); *H01L 2224/48137* (2013.01); *H01L 2224/8592* (2013.01); *H01L 2924/15151* (2013.01); *H01L 2924/16152* (2013.01); *H04R 2201/003* (2013.01)

(58) Field of Classification Search
CPC ........ B81B 2203/0315; B81C 1/00388; H04R 1/04; H04R 1/406; H04R 3/005; H04R 19/005; H04R 19/04; H04R 31/00; H01L 2224/48137; H01L 2224/8592; H01L 2924/15151; H01L 2924/16152
See application file for complete search history.

(56) References Cited

U.S. PATENT DOCUMENTS

| | | | |
|---|---|---|---|
| 8,170,244 B2 | 5/2012 | Ryan et al. | |
| 9,029,962 B1 | 5/2015 | Dreiza et al. | |
| 2007/0047746 A1 | 3/2007 | Weigold et al. | |
| 2007/0158769 A1 | 7/2007 | You | |
| 2007/0190858 A1 | 8/2007 | Stoneham et al. | |
| 2008/0063232 A1 | 3/2008 | Song | |
| 2008/0122457 A1* | 5/2008 | Taguchi | G01R 27/2605 324/679 |
| 2008/0192962 A1 | 8/2008 | Halteren | |
| 2008/0217709 A1* | 9/2008 | Minervini | B81B 7/0061 257/416 |
| 2009/0278217 A1 | 11/2009 | Laming et al. | |
| 2009/0309174 A1* | 12/2009 | Fueldner | B81B 3/0021 257/416 |
| 2010/0092020 A1 | 4/2010 | Ryan et al. | |
| 2010/0135514 A1 | 6/2010 | Hinke | |
| 2010/0246859 A1* | 9/2010 | David | H02M 3/07 381/120 |
| 2010/0303274 A1 | 12/2010 | Ryan et al. | |
| 2011/0127623 A1 | 6/2011 | Fueldner et al. | |
| 2012/0025334 A1 | 2/2012 | Chan et al. | |
| 2012/0250897 A1 | 10/2012 | Michel et al. | |
| 2012/0288130 A1 | 11/2012 | Dehe | |
| 2013/0028451 A1* | 1/2013 | de Roo | H04R 1/38 381/312 |
| 2013/0070951 A1* | 3/2013 | Tanaka | H04R 1/38 381/361 |
| 2013/0088247 A1* | 4/2013 | Tseng | G01L 1/205 324/693 |
| 2013/0195291 A1* | 8/2013 | Josefsson | H02M 3/07 381/174 |
| 2013/0236037 A1 | 9/2013 | Weigold et al. | |
| 2014/0226836 A1* | 8/2014 | Miyatake | G10L 21/0232 381/94.1 |
| 2014/0239352 A1* | 8/2014 | Wang | H04R 19/04 257/254 |
| 2014/0270250 A1* | 9/2014 | Muza | H04R 1/406 381/94.1 |
| 2014/0307885 A1* | 10/2014 | Schultz | H04R 3/005 381/71.7 |
| 2014/0376749 A1* | 12/2014 | Nielsen | H04R 19/005 381/122 |
| 2015/0003638 A1 | 1/2015 | Kasai | |
| 2016/0362293 A1 | 12/2016 | Smeys et al. | |
| 2018/0152169 A1 | 5/2018 | Goto et al. | |

FOREIGN PATENT DOCUMENTS

| | | | |
|---|---|---|---|
| CN | 101902673 A | | 12/2010 |
| CN | 102595294 A | * | 7/2012 |
| CN | 102595294 A | | 7/2012 |
| CN | 102595295 A | | 7/2012 |
| CN | 202679623 U | | 1/2013 |
| CN | 202949568 U | | 5/2013 |
| CN | 103200508 A | | 7/2013 |
| KR | 20120127261 A | | 11/2012 |
| WO | 2013129389 A1 | | 6/2013 |

OTHER PUBLICATIONS

Hsu, Shu-Ting, "High performance micro scanners for miniature laser projection displays," Technische Universitat Dresden, date of the submission Oct. 31, 2006, 145 pages.
SPM0406HE3H-SB, "Differential SiSonic Microphone With Enhanced RF Protection", Product Data Sheet, www.knowles.com, Knowles Electronics, May 2013, 11 pages.

* cited by examiner

SYSTEM AND METHOD FOR A MEMS TRANSDUCER

CROSS-REFERENCE TO RELATED APPLICATIONS

This application is a divisional of U.S. patent application Ser. No. 14/073,672, filed on Nov. 6, 2013, which application is hereby incorporated herein by reference.

TECHNICAL FIELD

The present invention relates generally to sensor technology, and, in particular embodiments, to a system and method for a MEMS transducer.

BACKGROUND

Transducers convert signals from one domain to another and are often used in sensors. One common sensor with a transducer that is seen in everyday life is a microphone that converts sound waves to electrical signals.

Microelectromechanical system (MEMS) based sensors include a family of transducers produced using micromachining techniques. MEMS, such as a MEMS microphone, gather information from the environment by measuring the change of physical state in the transducer and transferring the signal to be processed by the electronics, which are connected to the MEMS sensor. MEMS devices may be manufactured using micromachining fabrication techniques similar to those used for integrated circuits.

MEMS devices may be designed to function as oscillators, resonators, accelerometers, gyroscopes, pressure sensors, microphones, micro-mirrors. Many MEMS devices use capacitive sensing techniques for transducing the physical phenomenon into electrical signals. In such applications, the capacitance change in the sensor is converted to a voltage signal using interface circuits. However, the design of these interface circuits may become challenging when miniaturizing sensors in the presence of parasitic effects. For example, the presence of a coupled parasitic capacitance may reduce the effective gain of the sensor, that combined with the small size of a MEMS sensor may cause the device to be more easily affected by mechanical or electrical noise.

SUMMARY OF THE INVENTION

An embodiment as described herein includes a microelectromechanical system (MEMS) with a first MEMS transducer element, a second MEMS transducer element, and a semiconductor substrate. The first and second MEMS transducer elements are disposed at a top surface of the semiconductor substrate and the semiconductor substrate includes a shared cavity acoustically coupled to the first and second MEMS transducer elements.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely microphone transducers, and more particularly, MEMS microphones. Some of the various embodiments described herein include MEMS transducer systems, MEMS microphone systems, interface circuits for transducer and MEMS transducer systems, MEMS microphones producing differential signals, and multiple transducer microphone systems with differential signals. In other embodiments, aspects may also be applied to other applications involving any type of sensor or transducer converting a physical signal to another domain and interfacing with electronics according to any fashion as known in the art.

Figure 1:
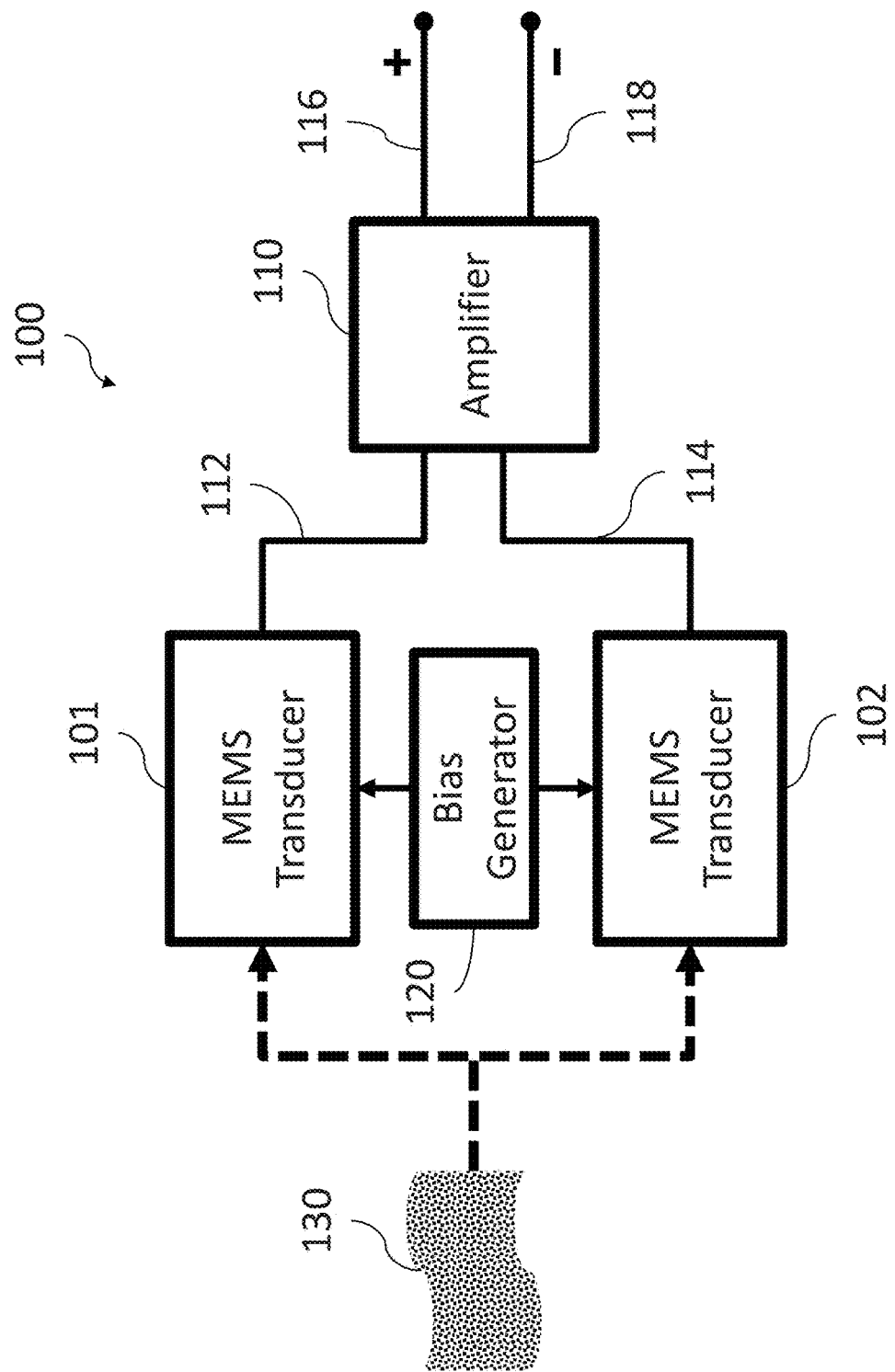
FIG. 1 illustrates a block diagram of an embodiment transducer system.

FIG. 1 illustrates a block diagram of an embodiment transducer system 100 including MEMS transducer 101, MEMS transducer 102, amplifier 110, and bias generator 120. As shown, a first differential signal is provided from MEMS transducers 101 and 102 to amplifier 110 via connection 112 and connection 114. Amplifier 110 amplifies the first differential signal and provides a second differential signal on output terminal 116 and output terminal 118.

According to an embodiment, MEMS transducers 101 and 102 are configured as microphones and convert acoustic signals into electrical signals. In such an embodiment, MEMS transducers 101 and 102 may receive an acoustic signal 130 through a shared sound port (not shown), convert the acoustic signal 130 to the electrical domain, and provide a differential electrical signal to amplifier 110 via connections 112 and 114. In the embodiment shown, bias generator 120 provides bias voltages to MEMS transducers 101 and 102. According to various embodiments, bias generator 120 provides a first bias voltage to MEMS transducer 101 and a second bias voltage to MEMS transducer 102. The first bias voltage may be different from the second bias voltage. In various embodiments, MEMS transducer 101 and 102 receive acoustic signal 130 and produce equal magnitude antiphase electrical signals on connections 112 and 114, forming a differential signal. In some embodiments, the first bias voltage is opposite in polarity to the second bias voltage which causes the electrical signals produced by the MEMS transducers 101 and 102 to be antiphase.

In alternative embodiments, the bias generator 120 provides a same bias voltage to MEMS transducers 101 and 102. In such an embodiment, the electrical signals produced by MEMS transducers 101 and 102 may be in phase. In some embodiments, the MEMS transducers are coupled with a shared transducing element (e.g. a double backplate MEMS microphone). In such an embodiment, the bias generator may provide the same bias voltage to MEMS transducer 101 and 102 and the electrical signals produced are antiphase. Various configurations will be discussed in further detail with reference to the remaining figures.

According to various embodiments, MEMS transducers 101 and 102 include a plurality of transducer elements. In a specific embodiment, MEMS transducer 101 may include two transducer elements and MEMS transducer 102 may include two transducer elements. MEMS transducer 101 and MEMS transducer 102 may also include more than two transducer elements. Each MEMS transducer or transducer element may be implemented using a single-backplate capacitive MEMS microphone. In some embodiments, each MEMS transducer is implemented using a double-backplate MEMS microphone or many double backplate MEMS microphones. In other embodiments, MEMS transducer 101 and 102 are the two backplates of one double backplate MEMS microphone.

Figure 2:
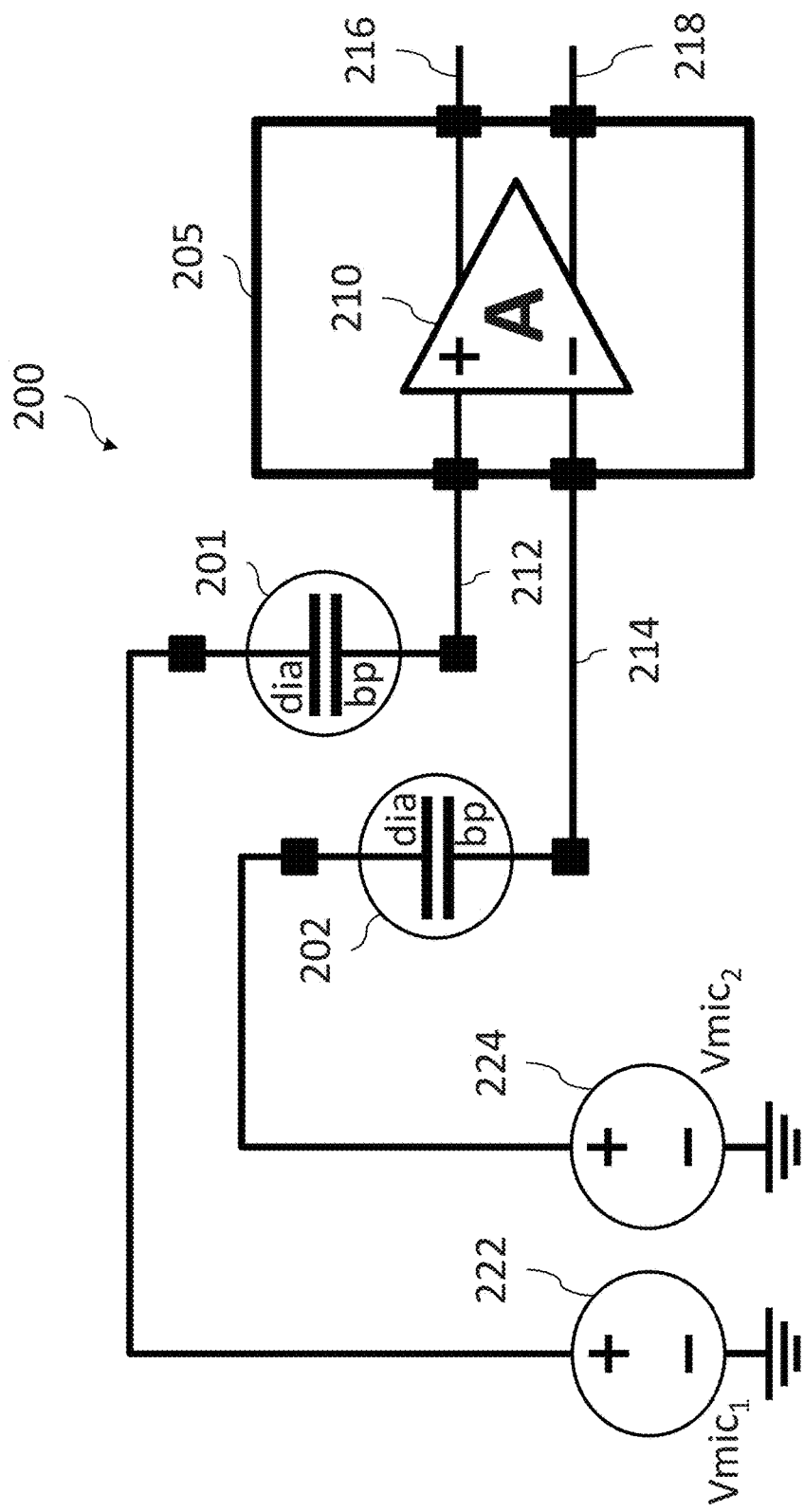
FIG. 2 illustrates a schematic of an embodiment transducer system that uses two bias voltages.

FIG. 2 illustrates a schematic of an embodiment transducer system 200 that has two bias voltage sources 222 and 224 coupled to two MEMS microphones 201 and 202. Bias voltage source 222 supplies a diaphragm of MEMS microphone 201 with a first bias voltage $V_{mic1}$ and bias voltage source 224 supplies a diaphragm of MEMS microphone 202 with a second bias voltage $V_{mic2}$. As discussed in reference to FIG. 1, MEMS microphones 201 and 202 may be acoustically coupled to a same input sound port. In some embodiments, the polarity of $V_{mic1}$ and $V_{mic2}$ may be opposite. In a specific embodiment, the first and second bias voltages may be related by the equation $V_{mic1} = -V_{mic2} + 2 \cdot V_{offset}$, where $V_{offset}$ (not shown) is a bias voltage within circuit 205 that may help bias differential amplifier 210. In a specific implementation, $V_{offset}$ may be 0.5 V, for example. In various embodiments, the bias voltages supplied to MEMS microphones 201 and 202 may cause signals produced by MEMS microphones 201 and 202 and supplied to lines 212 and 214 to be antiphase. Antiphase signals on lines 212 and 214 may form a differential signal.

The differential signal is supplied to a differential amplifier 210, which supplies an amplified differential output on lines 216 and 218. Differential amplifier 210 is included in circuit 205. In various embodiments, circuit 205 may be implemented on an integrated circuit (IC). In further embodiments, the IC may be attached on a chip with the MEMS microphones 201 and 202, or circuit 205 may be fabricated on a shared substrate with the MEMS microphones 201 and 202. According to the embodiment shown, backplates of MEMS microphones 201 and 202 are coupled to lines 212 and 214, respectively. In alternative embodiments, the backplates and diaphragms of MEMS microphones 201 and 202 are coupled in various other configurations.

Figure 3:
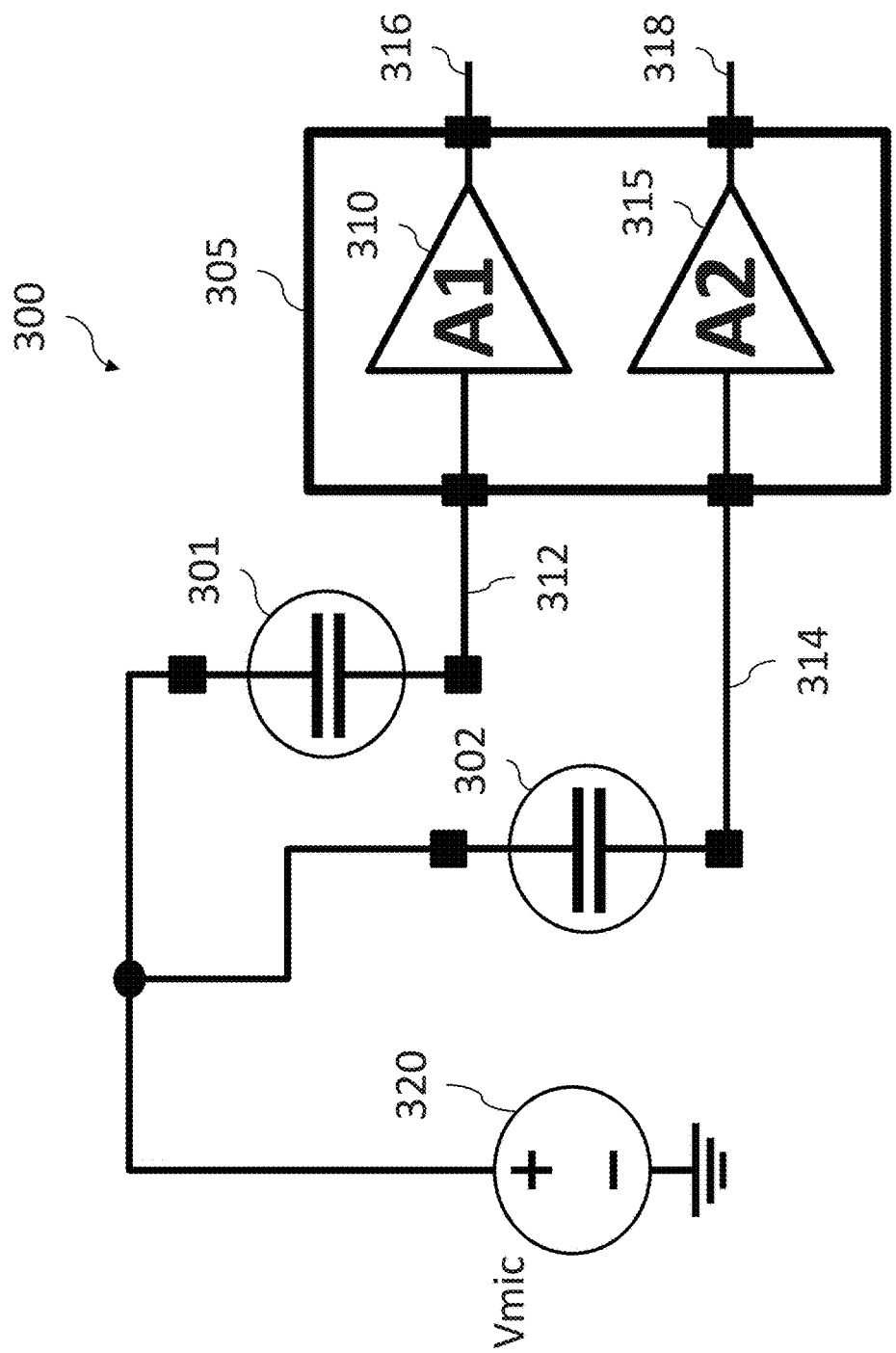
FIG. 3 illustrates a schematic of another embodiment transducer system using two amplifiers.

FIG. 3 illustrates a schematic of another embodiment transducer system 300 with two amplifiers 310 and 315 in amplifier block 305. In the embodiment shown, bias voltage source 320 supplies MEMS microphones 301 and 302 with bias voltage $V_{mic}$. Amplifier 310 has a gain of A1 and amplifier 315 has a gain of A2. Gains A1 and A2 may be of equal magnitude and opposite sign. In such embodiments, amplifier block 305 may receive in-phase signals on lines 312 and 314 from MEMS microphones 301 and 302 and produce an amplified differential output signal on lines 316 and 318.

Figure 4:
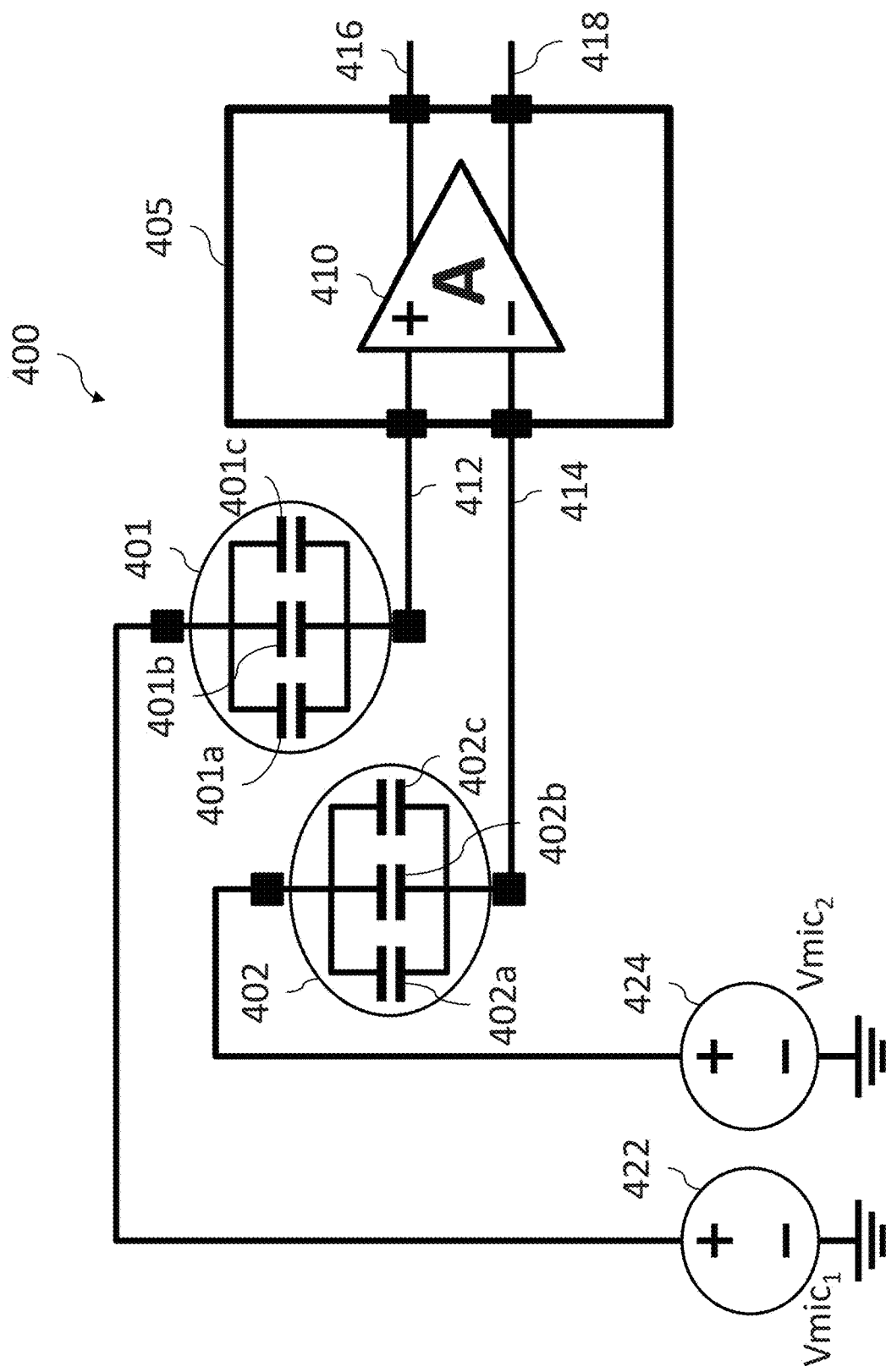
FIG. 4 illustrates a schematic of a further embodiment transducer system using multiple MEMS devices.

FIG. 4 illustrates a schematic of a further embodiment transducer system 400 using multiple MEMS devices. MEMS transducers 401 and 402 may each include a plurality of transducer elements. In a specific embodiment, MEMS transducer 401 may include capacitive MEMS microphones 401a-401c and MEMS transducer 402 may include capacitive MEMS microphones 402a-402c. This example is purely illustrative, as MEMS transducers 401 and 402 may include other types of transducing elements and any number of elements in each MEMS transducer. MEMS transducers 401 and 402 are biased by two bias voltage sources 422 and 424 such that signals on lines 412 and 414 may be antiphase and form a differential signal. According to various embodiments, amplifier block 405 receives the differential signal on lines 412 and 414, amplifies the differential signal with amplifier 410, and provides an amplified differential output signal on lines 416 and 418.

With reference to FIGS. 2-4, transducer systems 200, 300, and 400 are embodiments showing various configurations of transducers and interface circuits. These embodiments may be combined or substituted with each other according to system requirements understood by a designer or engineer skilled in the art. According to various embodiments, the MEMS transducers shown may include acoustic transducers that are coupled to a shared acoustic signal.

Figure 5:
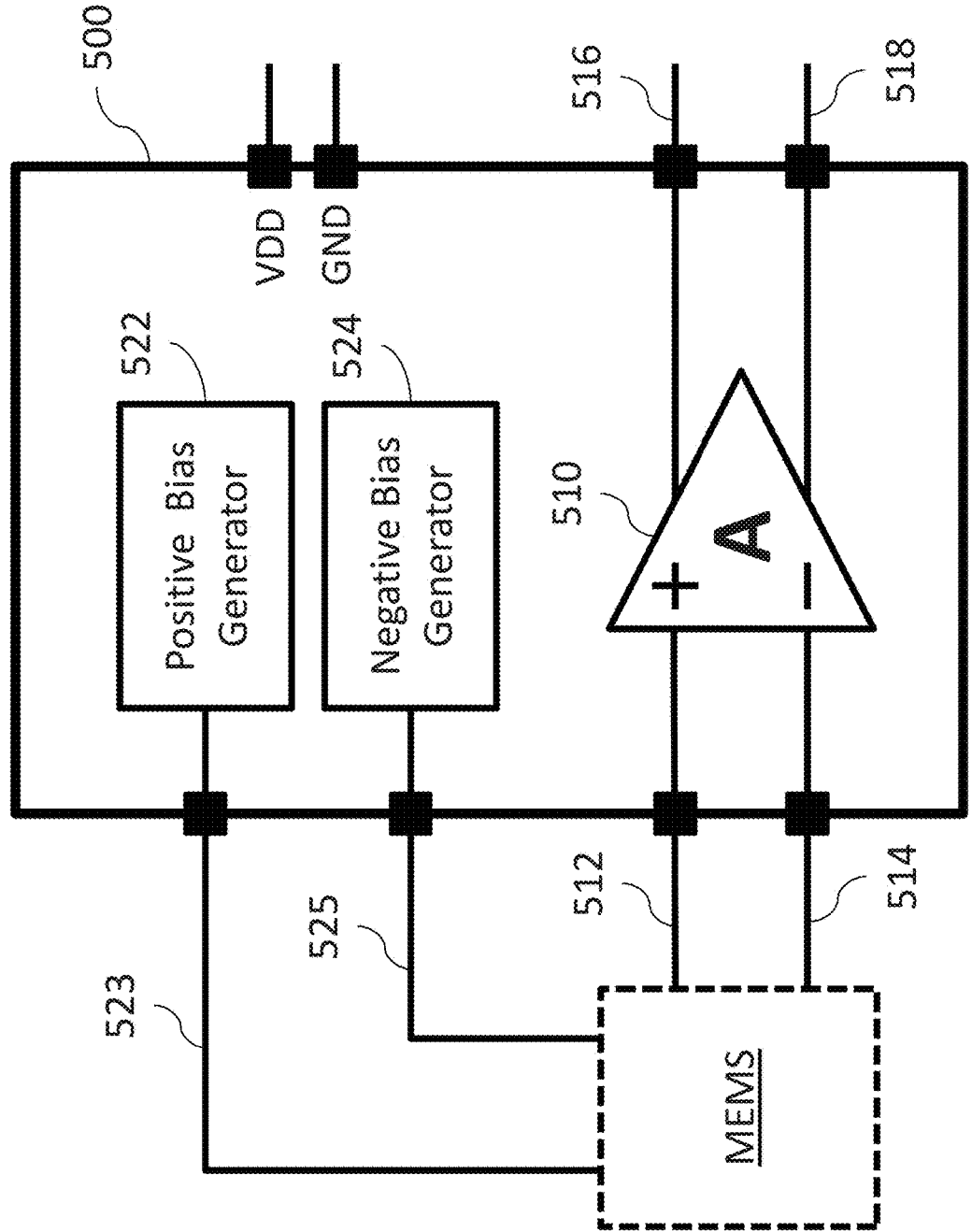
FIG. 5 illustrates a simplified block diagram of an embodiment transducer interface circuit.

FIG. 5 illustrates a simplified block diagram of an embodiment transducer interface circuit 500 interfaced with transducer system MEMS. Interface circuit 500 may be implemented as an IC or as discrete components and contains bias generators 522 and 524 as well as an amplifier 510. In the embodiment shown, amplifier 510 is a differential amplifier. In other embodiments, various amplifier configurations may be used. Interface circuit 500 receives converted electrical signals from transducer system MEMS via lines 512 and 514, and provides bias voltages from positive bias generator 522 and negative bias generator 524 to transducer system MEMS via lines 523 and 525. In some embodiments, positive bias generator 522 and negative bias generator 524 may be implemented in a single block with two output voltages.

According to various embodiments, amplifier 510 amplifies the converted electrical signals received on lines 512 and 514 and provides a differential output signal on lines 516 and 518. In some embodiments, interface circuit 500 may be fabricated on a same die as transducer system MEMS. In other embodiments, transducer system MEMS and interface circuit 500 may be fabricated on separate dies and attached to a same chip or in a same package.

Figure 6:
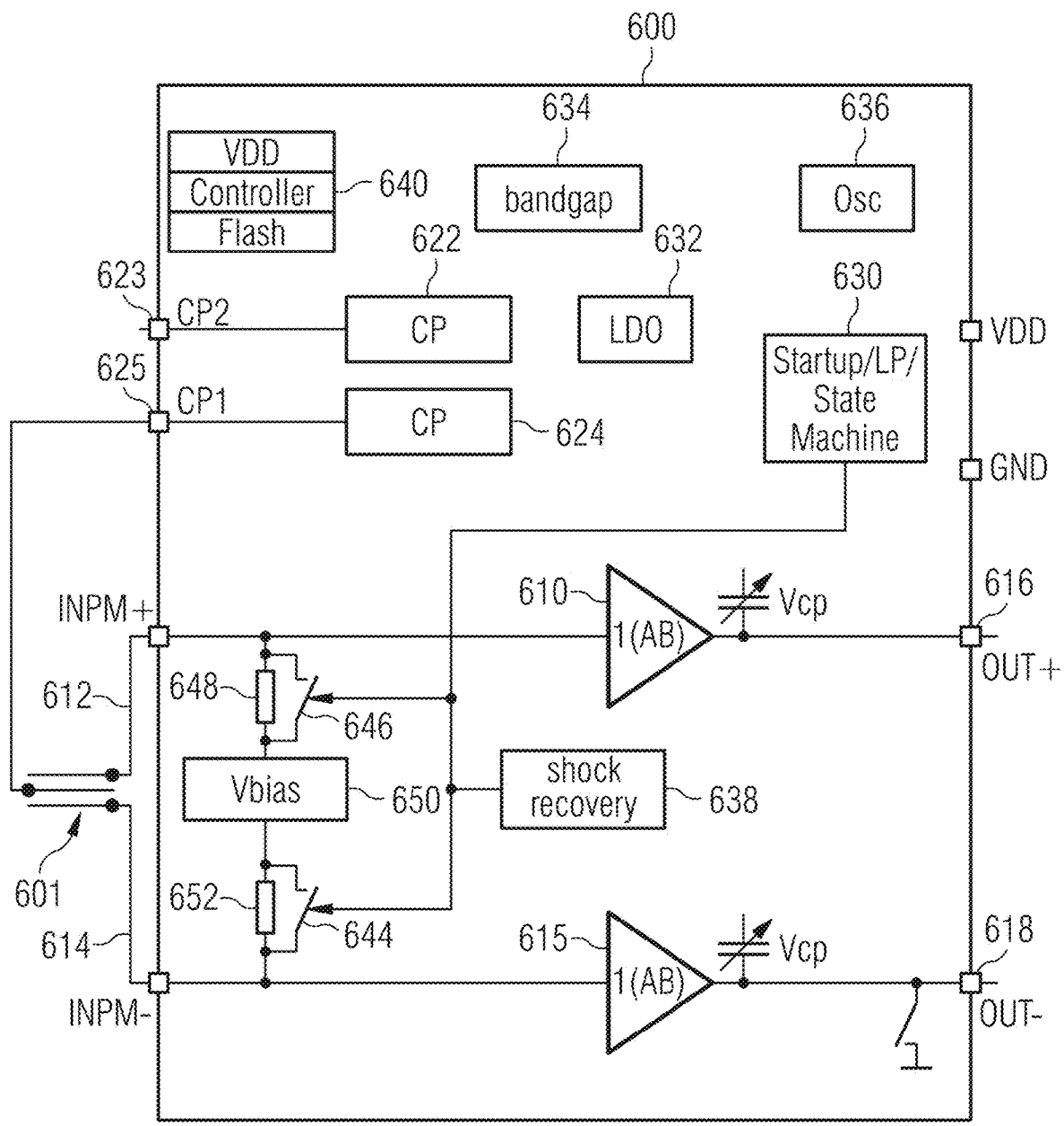
FIG. 6 illustrates a more detailed block diagram of an embodiment transducer interface circuit.

FIG. 6 illustrates a more detailed block diagram of an embodiment transducer interface circuit 600 including amplifiers 610 and 615 which receive converted electrical signals from an acoustic transducer 601, amplify the electrical signals, and provide an output differential signal to terminals 616 and 618. In the embodiment shown, interface circuit 600 is implemented as an IC and contains additional functional blocks, including state machine 630, low-dropout regulator 632, bandgap voltage reference 634, oscillator 636, controller and memory block 640, charge pumps 622 and 624, shock recovery 638, and bias voltage 650. An interface IC may include additional functional blocks or fewer functional blocks according to system requirements and interface circuit 600 is meant as a purely illustrative embodiment.

According to the embodiment shown, charge pumps 622 and 624 are specific implementations of bias voltage generators as discussed earlier. Charge pump 622 may provide a negative bias voltage to terminal 623 and charge pump 624 may provide a positive bias voltage to terminal 625. In the embodiment shown, acoustic transducer 601 is schematically shown as a double backplate MEMS microphone. In various embodiments, acoustic transducer 601 may be implemented as any of the configurations or combinations thereof discussed herein. Depending on how acoustic transducer 601 is implemented, amplifiers 610 and 615 and charge pumps 622 and 624 are configured to match. In the embodiment shown, amplifiers 610 and 615 are single ended amplifiers with the same gain AB. Acoustic transducer 601 is biased by charge pump 624 via terminal 625 and may provide a differential signal to inputs 612 and 614.

Within interface circuit 600, state machine 630 may provide control signals to switches 644 and 646 in order to bias inputs 612 and 614 via bias voltage 650 dependent on various modes of operation, such as start-up, low power, regular, and shock recovery, for example. Shock recovery 638 may also provide control signals to switches 646 and 644. Low-dropout regulator 632 may provide a regulated voltage throughout interface circuit 600 and bandgap voltage reference 634 may provide a reference voltage. Oscillator 636 may be used for all synchronous blocks such as state machine 630 and controller and memory 640, for example. Controller and memory 640 may set voltages, thresholds, and modes of operations of various other blocks within interface circuit 600. According to some embodiments, controller and memory 640 may access settings and values in a programmable memory and setup interface circuit 600 via control signals distributed throughout the various functional blocks. Charge pumps 622 and 624 may be configured to provide various bias voltages to terminals 623 and 625 for acoustic transducer biasing.

Figure 7:
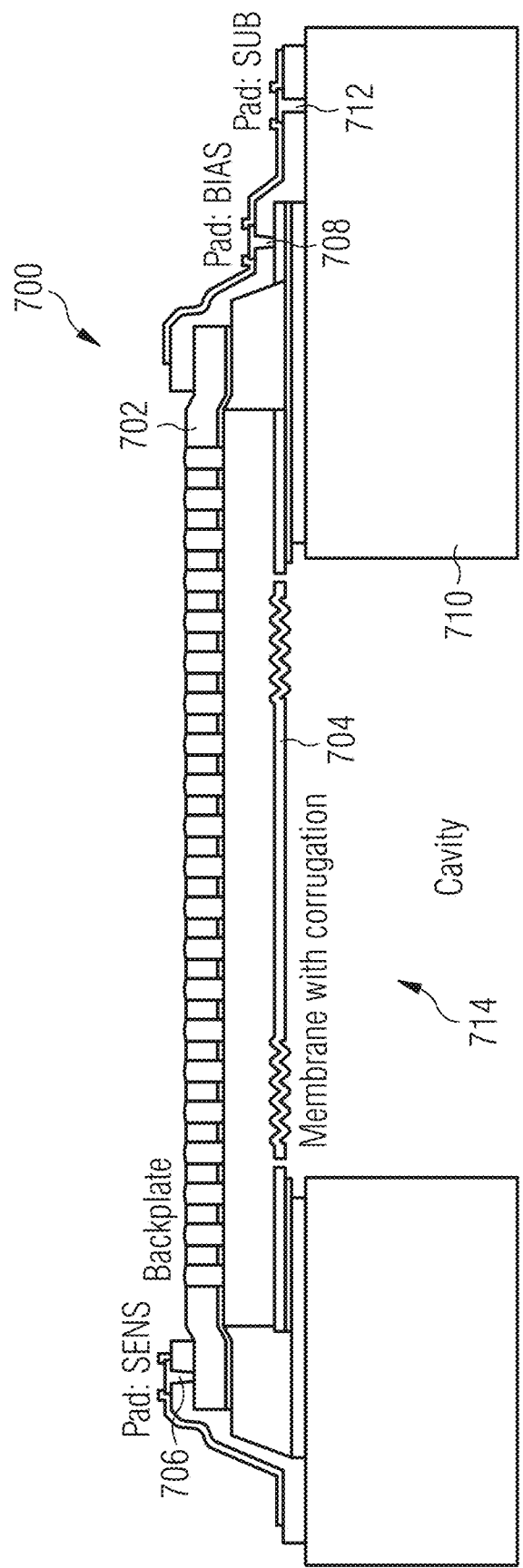
FIG. 7 illustrates a schematic of an embodiment MEMS transducer.

FIG. 7 illustrates a schematic of an embodiment MEMS transducer 700 implemented as a single backplate capacitive MEMS microphone including a perforated backplate 702 and a deflectable membrane or diaphragm 704, both fabricated on a substrate 710. In the embodiment shown, backplate 702 has holes throughout to allow air pressure to equalize. Backplate 702 and diaphragm 704 are fabricated over a cavity 714 in substrate 710. In various embodiments, the cavity 714 is acoustically coupled to a sound port in a package or chip (not shown). Electrical coupling is made to diaphragm 704 via pad 708, to backplate 702 via pad 706, and to substrate 710 via pad 712.

According to an embodiment, a sound wave enters a transducer system through the sound port and propagates into cavity 714. The sound wave causes diaphragm 704 to deflect and vibrate, altering the distance between diaphragm 704 and backplate 702. Because both backplate 702 and diaphragm 704 are made out of electrically conductive materials, the two structures form the parallel plate electrodes of a capacitor. When diaphragm 704 is displaced by the sound wave, the capacitance between backplate 702 and diaphragm 704 changes as the distance changes, and an output voltage variation is thus measureable on pad 706. The output voltage may be fed to an interface circuit and MEMS transducer 700 may be coupled with a plurality of other MEMS transducers as described herein. The mathematical relationships between diaphragm and backplate size, separation distance, displacement, output voltages, and sound pressure levels is well known to those skilled in the art.

Figure 8A:
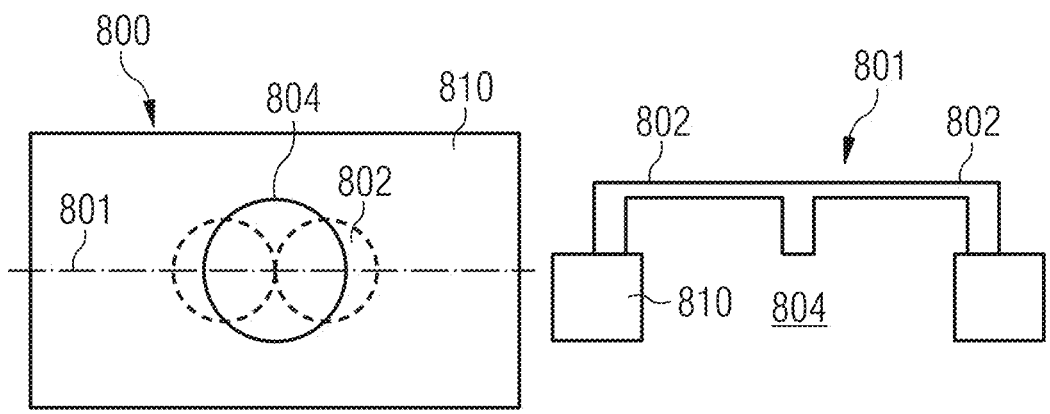
FIGS. 8a-8d illustrate schematics of embodiment sound port configurations.

FIGS. 8a-8d illustrate schematics of embodiment sound port configurations with top views 800, 820, 840, and 860 and cross-sections 801, 821, 841, and 861. FIG. 8a illustrates an embodiment microphone having two transducer elements 802 fabricated on a same die and disposed on a substrate such as carrier chip 810 over single sound port 804. In various embodiments, carrier chip 810 may include other substrate types besides carrier chips. In some embodiments, carrier chip 810 is a semiconductor substrate.

Figure 8B:
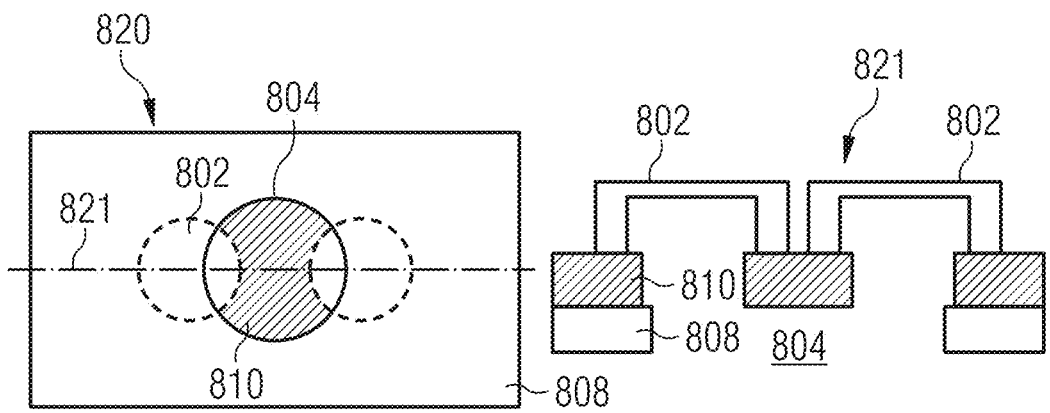

FIG. 8b illustrates an embodiment microphone having two transducer elements 802 fabricated on separate dies and disposed on carrier chip 810 that is attached to a spacer or second carrier chip 808 over sound port 804. This same configuration is possible with multiple MEMS fabricated on the same die over sound port 804.

Figure 8C:
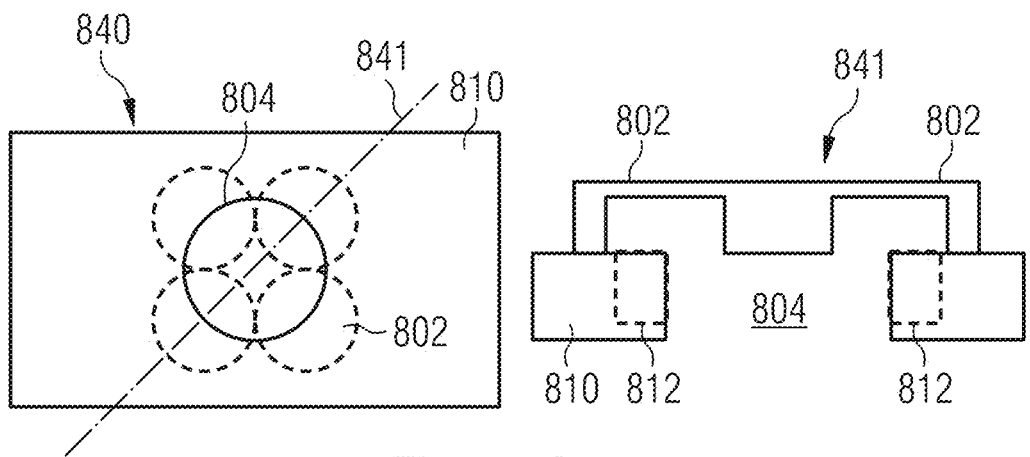

FIG. 8c illustrates an embodiment microphone having four transducer elements 802 fabricated on a same die and disposed on carrier chip 810 over sound port 804. Regions 812 in substrate 810 may be removed (e.g. etched) for better sound propagation.

Figure 8D:
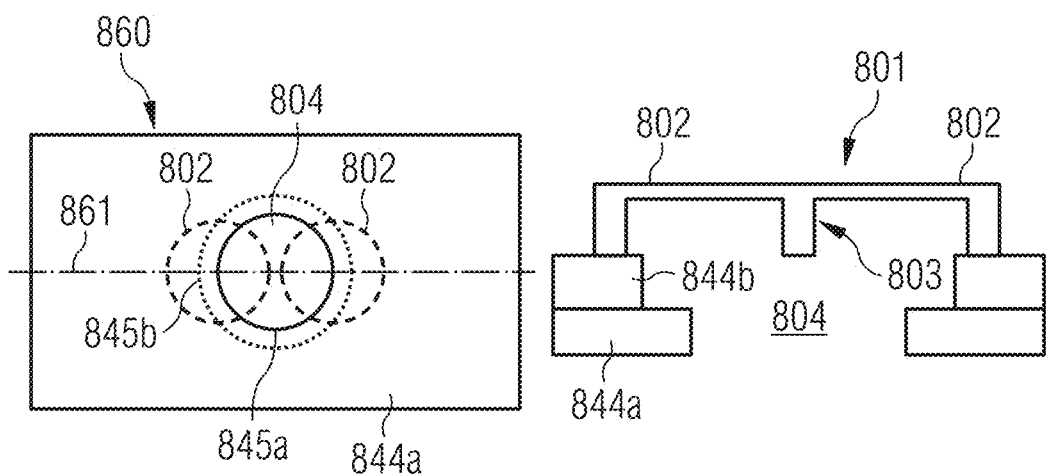

FIG. 8d illustrates an embodiment microphone having two transducer elements 802 fabricated on a same die 803 and disposed on a substrate 844b over sound port 804. Substrate 844b is attached to a substrate 844a. In the embodiment shown, substrate 844b and substrate 844a may be first and second layers of a PCB, package, or case. In a specific embodiment, substrates 844a and 844b are both PCBs. Substrate 844a and substrate 844b may be made of PCB materials, epoxy, plastic, composite, metal, glass, ceramic, or any combination thereof. As shown, substrate 844b may have an opening 845b disposed below both transducer elements 802 and substrate 844a may have a narrower opening 845a disposed below opening 845b of substrate 844b. Sound port 804 may be formed in a cavity including openings 845a and 845b in substrate 844a and substrate 844b. According to various embodiments, substrate 844a and 844b may be a same package or PCB. In such embodiments, openings 845a and 845b may be etched, drilled, or formed with any method known in the art. In another embodiment, substrates 844a and 844b may be two separate structures, such as substrates or PCBs, for example. In such an embodiment, openings 845a and 845b may be formed once substrates 844a and 844b are bonded together by drilling, etching, or other mechanisms, or openings 845a and 845b may be formed before substrates 844a and 844b are bonded together with similar mechanisms. In some embodiments, substrates 844a and/or 844b may be semiconductor substrates composed of any semiconductor material, metal, plastic, oxide, any composite material, and/or any combination thereof.

The various embodiment microphones in FIGS. 8a-8d may be attached to a package with sound port 804 aligned with an external sound port (not shown). In some embodiments, carrier chip 810 may be disposed on a PCB over a sound port in the PCB. Carrier chip 810 may also be a part of a package or a circuit board on which transducer elements 802 are attached. In various embodiments, carrier chip 810 and second carrier chip 808 may be a semiconductor material such as silicon, a printed circuit board (PCB), a polymer, a glass, an aluminum, or a composite. In some embodiments, carrier chip 810 and second carrier chip 808 are not made of the same material. The sound port configurations shown in FIGS. 8a-8d are illustrative and may be extended to include any number of transducer elements, spacer or carrier chips, and/or packaging attachments as necessary. In the embodiments described, carrier chip 810 and second carrier chip 808 may be any shape, such as a ring for example, and are not limited to the rectangular cutouts depicted. According to one embodiment, sound port 804 and/or cavity 714 are filled with an acoustically conductive material.

Figure 9:
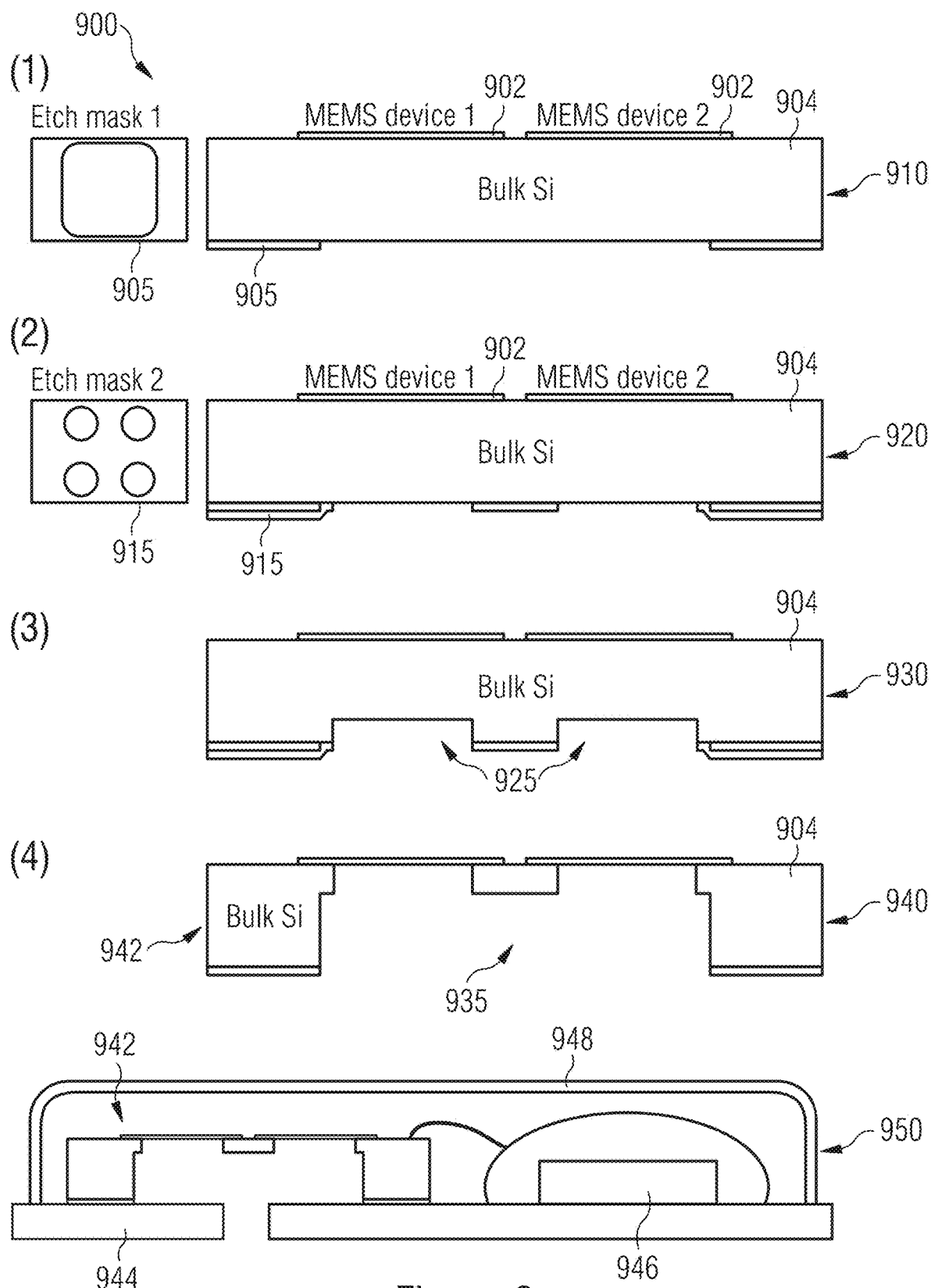
FIG. 9 illustrates a diagram of an embodiment fabrication sequence.

FIG. 9 illustrates a diagram of an embodiment fabrication sequence 900 including steps 910, 920, 930, 940, and 950. In the embodiments shown, MEMS transducers 902 are fabricated on substrate 904. Substrate 904 may include many materials and is shown as bulk silicon. Step 910 in fabrication sequence 900 includes placing etch mask 905 on substrate 904, opposite to MEMS transducers 902. In various embodiments, placing etch mask 905 on substrate 904 may include depositing a layer of photoresist, exposing the photoresist according to a pattern defined by etch mask 905, and developing the photoresist. In other embodiments, placing etch mask 905 on substrate 904 may include depositing a layer of a first masking material, such as silicon dioxide for example. The layer of first masking material may then be patterned according to a photolithographic process and wet-chemical or plasma etched to form etch mask 905.

Step 920 in fabrication sequence 900 includes placing a second etch mask 915 over etch mask 905 on substrate 904. Placing etch mask 915 may include similar steps to placing etch mask 905. In various embodiments, placing etch mask 915 may include depositing a layer of a second masking material, such as photoresist, carbon, or a stack of silicon nitride and silicon dioxide and patterning with a photolithographic process and a wet-chemical or plasma etch to form etch mask 915.

Step 930 in fabrication sequence 900 includes etching cavities 925 in substrate 904 according to etch mask 915 with a deep-reactive-ion-etch (DRIE) process, for example. As shown, cavities 925 are etched to a depth not equal to the thickness of substrate 904. Step 940 in fabrication sequence 900 includes removing etch mask 915 with a plasma or wet-chemical etch and etching cavity 935 with a DRIE process, for example, according to etch mask 905 in substrate 904. Finally, step 950 in fabrication process 900 includes packaging MEMS microphone 942 by attaching MEMS microphone 942 to a package 944, sealing with a lid 948, and coupling to sense electronics in IC 946. According to various embodiments, MEMS microphone 942 and IC 946 may be combined on a same die. Package 944 may be implemented as a printed circuit board (PCB), a structural polymer material, or any other structural material.

Figure 10:
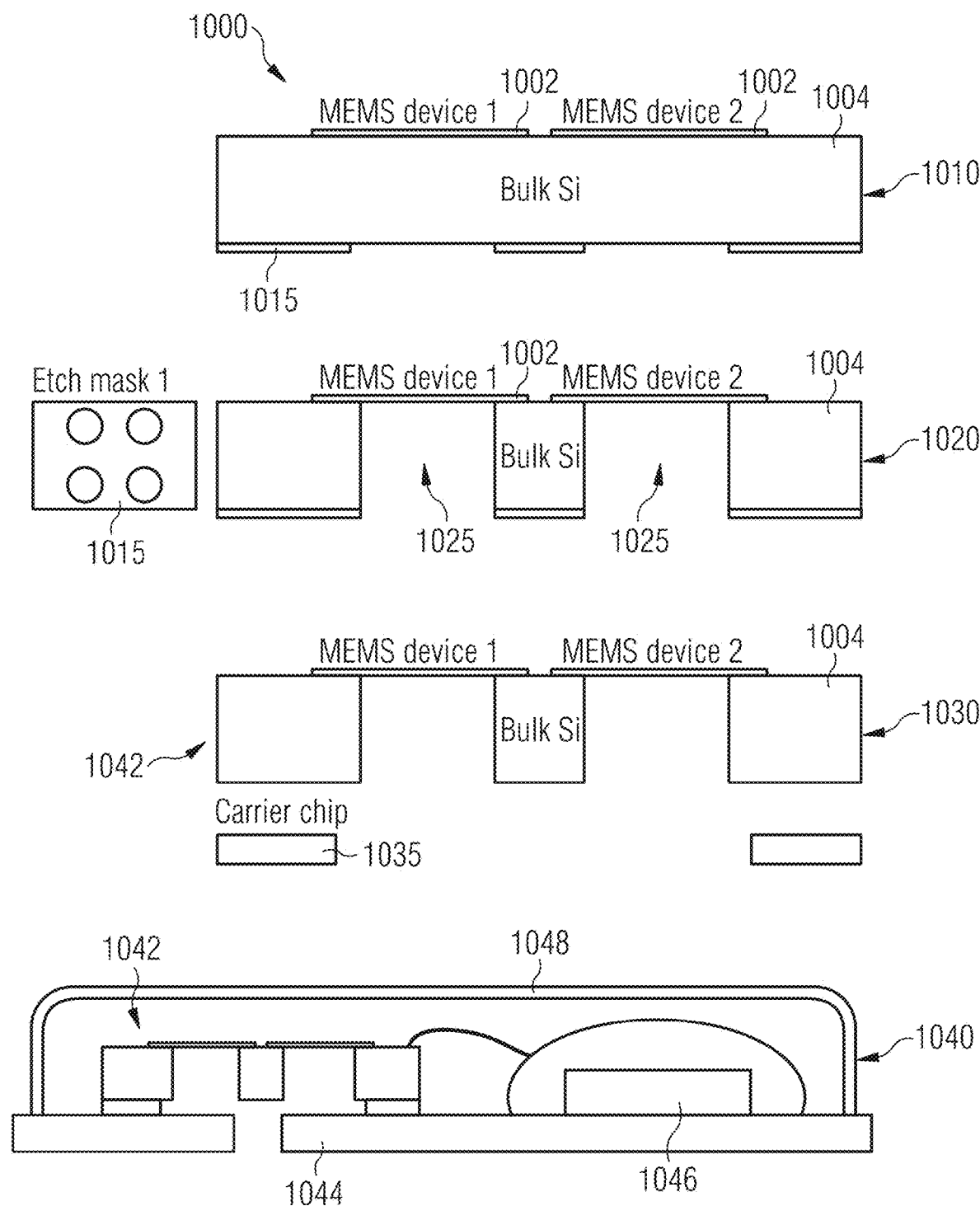
FIG. 10 illustrates a diagram of a further embodiment fabrication sequence.

FIG. 10 illustrates a diagram of a further embodiment fabrication sequence 1000 including steps 1010, 1020, and 1030. In the embodiment shown, MEMS transducers 1002 are fabricated on substrate 1004. Step 1010 in fabrication sequence 1000 includes placing etch mask 1015 on substrate 1004. Step 1020 in fabrication sequence 1000 includes etching cavities 1025 in substrate 1004 according to a pattern defined by etch mask 1015.

Step 1030 in fabrication sequence 1000 includes attaching MEMS microphone 1042 to a carrier chip 1035. Carrier chip 1035 may be formed with a polymer, aluminum, glass, or steel, for example. Step 1040 in fabrication sequence includes packaging MEMS microphone 1042 by attaching MEMS microphone 1042 to package 1044, coupling to IC 1046, and enclosing with lid 1048. In various embodiments, steps and materials may be similar to those described with reference to FIG. 9 and fabrication sequence 900.

In some embodiments, carrier chip 1035 may be attached to a package or PCB before MEMS microphone 1042 is attached to carrier chip 1035. In an alternative process, carrier chip 1035 is processed with a wafer of glass or silicon of the same size and with the same spacing (i.e. pitch) as the wafer comprising MEMS microphone 1042 and substrate 1004. In such an embodiment, the MEMS microphone wafer may be bonded to carrier chip 1035 with an anodic, eutectic, or polymeric bonding process, for example. The MEMS microphone 1042 with the bonded carrier chip 1035 may then be diced and packaged.

Figure 11A:
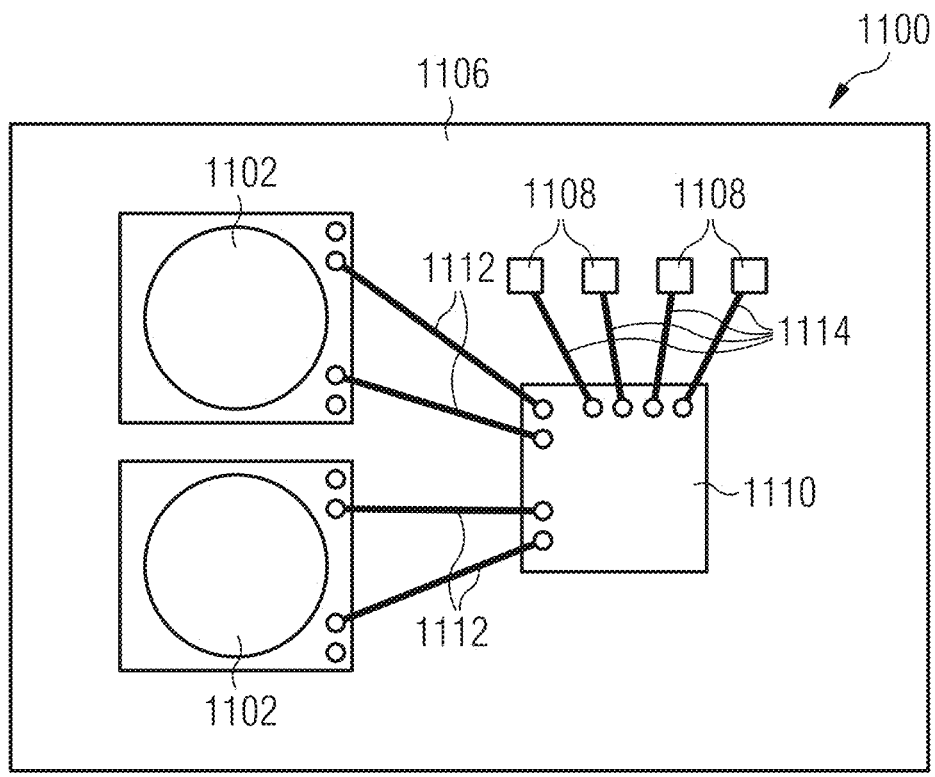
FIGS. 11a-11b illustrate schematic views of an embodiment transducer system.
Figure 11B:
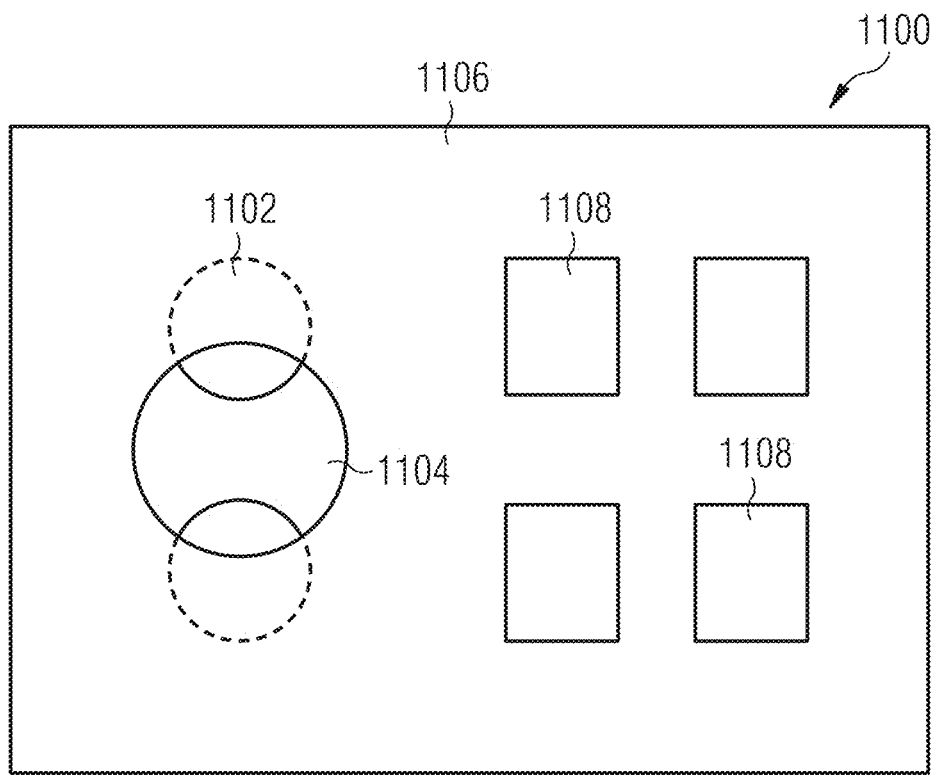

FIGS. 11a-11b illustrate schematic views of an embodiment transducer system 1100. FIG. 11a illustrates a top view of embodiment transducer system 1100 with two MEMS transducers 1102 coupled to an IC 1110 via electrical connections 1112. MEMS transducers 1102 and IC 1110 are attached to board 1106. In various embodiments, board 1106 may include a PCB, a polymer, a polymer composite material, or other structural materials. IC 1110 may also be coupled to bond pads 1108 via electrical connections 1114. According to various embodiments, electrical connections 1112 and 1114 are wire bonds. In other embodiments, electrical connections 1112 and 1114 may be pre-routed connections on a PCB 1106.

FIG. 11b illustrates a bottom view of embodiment transducer system 1100 showing a sound port 1104 overlapping sense elements of MEMS transducers 1102. In various embodiments, sound port 1104 is open to an external environment, and sound waves propagate through sound port 1104 to reach MEMS transducers 1102. MEMS transducers 1102 convert sound signals to electrical signals and feed the electrical signals to IC 1110. According to various embodiments, IC 1110 provides an amplified differential signal to bond pads 1108, shown from the bottom view to have larger physical area for external connections. In some embodiments, bond pads 1108 may be coupled to external wires, be placed in an embedded system package, or be coupled to a system-on-chip (SoC).

Figure 12A:
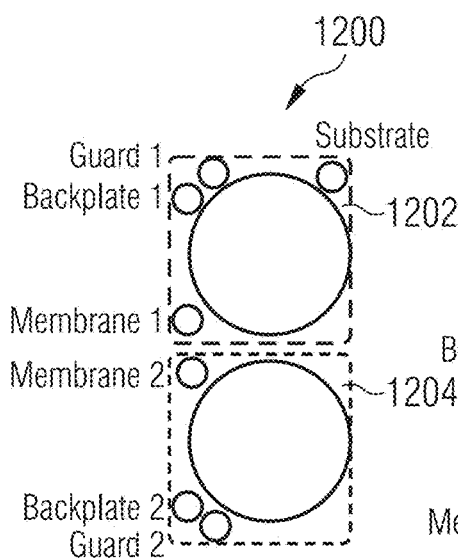
FIGS. 12a-12c illustrate schematics of embodiment transducer configurations.
Figure 12B:
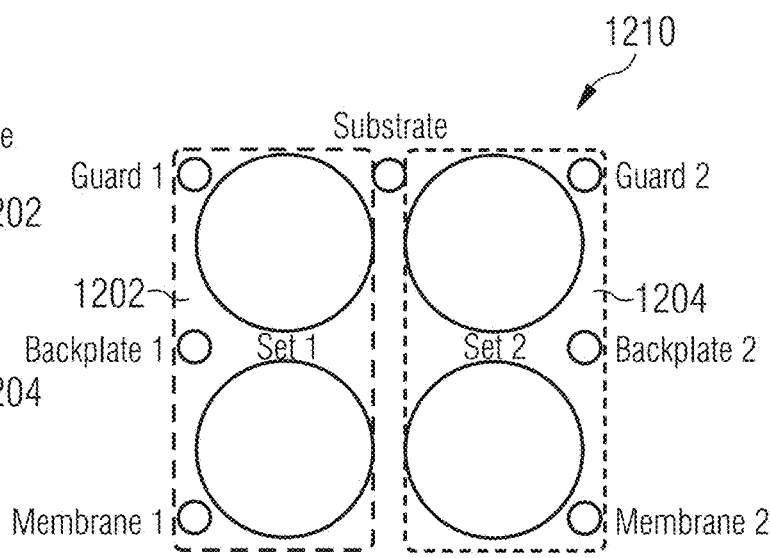
Figure 12C:
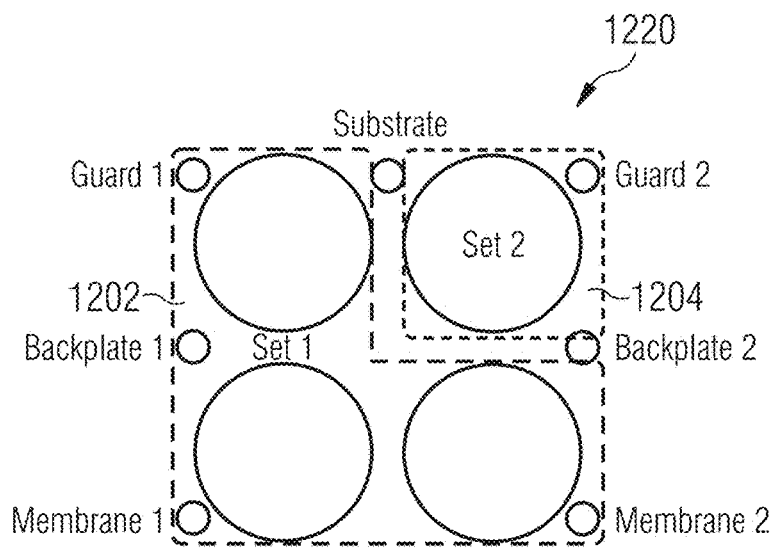

FIGS. 12a-12c illustrate schematics of embodiment transducer configurations with transducer systems 1200, 1210, and 1220. FIG. 12a illustrates embodiment transducer system 1200 with two transducers 1202 and 1204, each with a single transducer element. According to various embodiments, transducers 1202 and 1204 may include capacitive MEMS microphones, for example, such as single or double backplate MEMS microphones. As described with reference to other figures included herein, transducers 1202 and 1204 may be biased with a same or different bias voltage by a bias voltage generator (not shown) coupled to diaphragm or membrane pads 1 and 2, respectively. Transducers 1202 and 1204 may also provide a differential signal via backplate pads 1 and 2.

FIG. 12b illustrates embodiment transducer system 1210 with two transducers 1202 and 1204, each with two transducer elements. In the embodiment shown, both transducer elements are coupled to backplate pad 1 and membrane pad 1 for transducer 1202 and both transducer elements are coupled to backplate pad 2 and membrane pad 2 for transducer 1204. According to various embodiments, transducers 1202 and 1204 may have a same bias voltage or a different bias voltage and may provide a differential output signal.

FIG. 12c illustrates embodiment transducer system 1220 with two transducers 1202 and 1204 with an unequal number of transducer elements. Transducer 1202 includes three transducer elements and transducer 1204 includes one transducer element. Again, the transducer elements of transducer 1202 have common backplate and diaphragm couplings to backplate pad 1 and membrane pad 1, respectively. The configurations shown in FIGS. 12a-12c are purely illustrative and should not be construed in a limited sense. More than four transducer elements are easily contemplated herein and any configuration thereof may be used.

As shown in FIGS. 12a-c, some embodiment MEMS may also include guard pads, which may be used to reduce the effect of parasitic capacitances. In such cases, Guard 1 and Guard 2 pins may be connected to an interface circuit that provides the same signal that is generated at the backplate.

Figure 13:
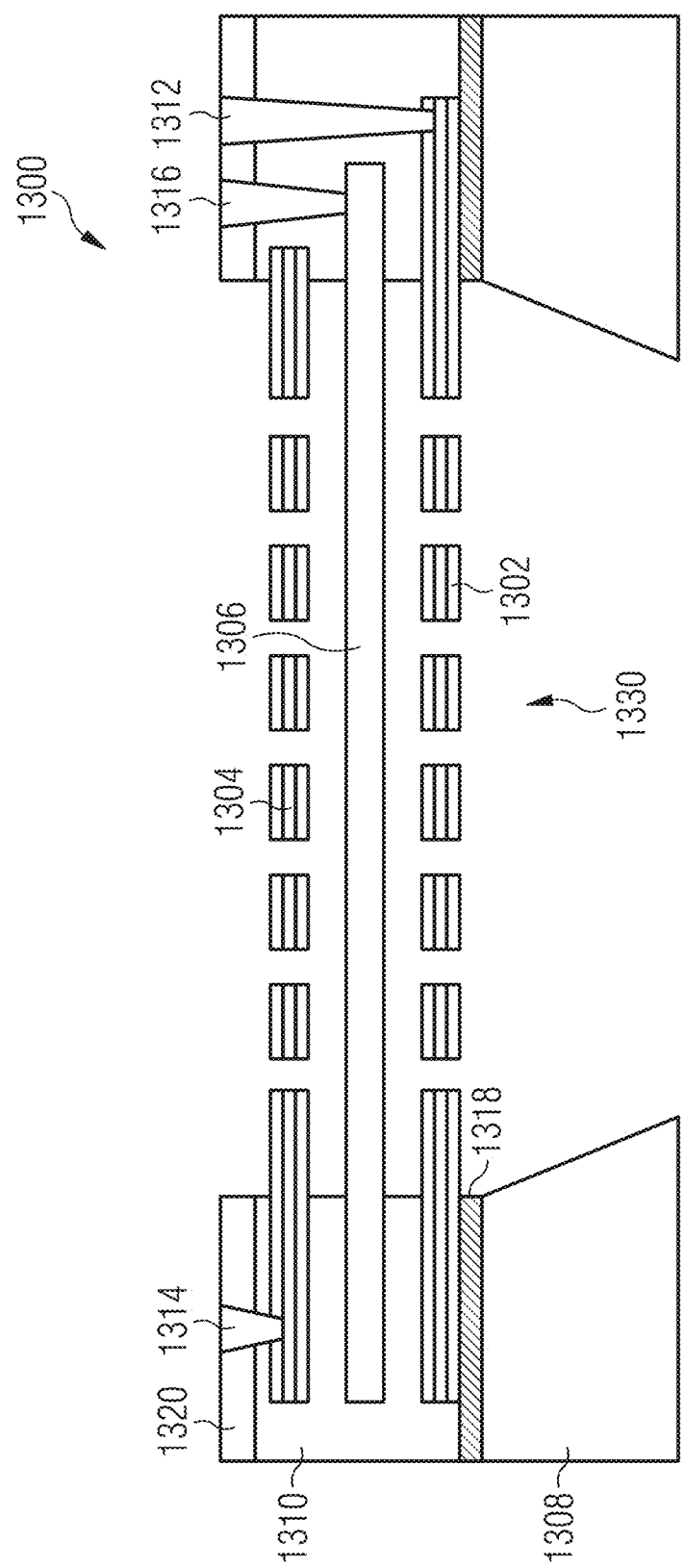
FIG. 13 illustrates a schematic of an embodiment dual backplate MEMS transducer.

FIG. 13 illustrates a schematic of an embodiment dual backplate MEMS transducer 1300 having a first backplate 1302 and a second backplate 1304 on opposite sides of a diaphragm 1306, all coupled to first substrate 1310. Second substrate 1308 may be separated from first substrate 1310 by an interface layer 1318 and first substrate 1310 may be covered by a passivation layer 1320. Electrical contacts 1312, 1314, and 1316 are made through passivation layer 1320 and first substrate 1310 to backplate 1302, backplate 1304, and diaphragm 1306, respectively.

According to an embodiment, a sound wave incident on sound port 1330 will propagate through perforated backplate 1302 and cause diaphragm 1306 to deflect. As diaphragm 1306 deflects, separation distances between the diaphragm 1306 and backplates 1302 and 1304 will change, thereby changing the capacitances. The change in capacitance is measurable as a voltage change on electrical contacts 1312, 1314, and 1316. According to various embodiments, diaphragm 1306 may have a bias voltage applied via electrical contact 1316 and backplates 1302 and 1304 may provide a differential signal output via electrical contacts 1312 and 1314. In various embodiments, because backplates 1302 and 1304 are located on opposite sides of diaphragm 1306, output signals to electrical contacts 1312 and 1314 are antiphase.

Figure 14:
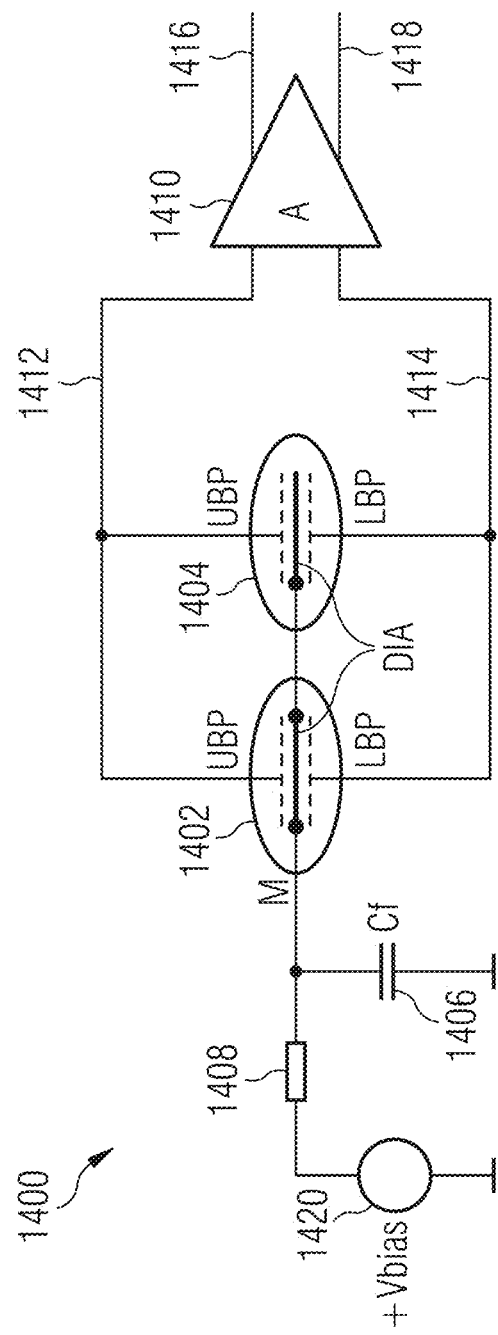
FIG. 14 illustrates a schematic of an embodiment dual backplate MEMS transducer system.

FIG. 14 illustrates a schematic of an embodiment dual backplate MEMS transducer system 1400 with two dual backplate MEMS microphones 1402 and 1404 coupled to an amplifier 1410. Each dual backplate MEMS microphones 1402 and 1404 may include a lower backplate (LBP), a diaphragm (DIA), and an upper backplate (UBP). Dual backplate MEMS microphones 1402 and 1404 are biased by a bias voltage generator 1420 through a resistor 1408 and a capacitor 1406. In various embodiments, an incident sound wave on a shared sound port (not shown) for dual backplate MEMS microphones 1402 and 1404 is converted to a differential signal on lines 1412 and 1414. Amplifier 1410 receives the differential signal and provides an amplified differential output signal on lines 1416 and 1418. Various combinations, substitutions, and configurations may be implemented according to the various embodiments described with reference to the figures contained herein.

Figure 15:
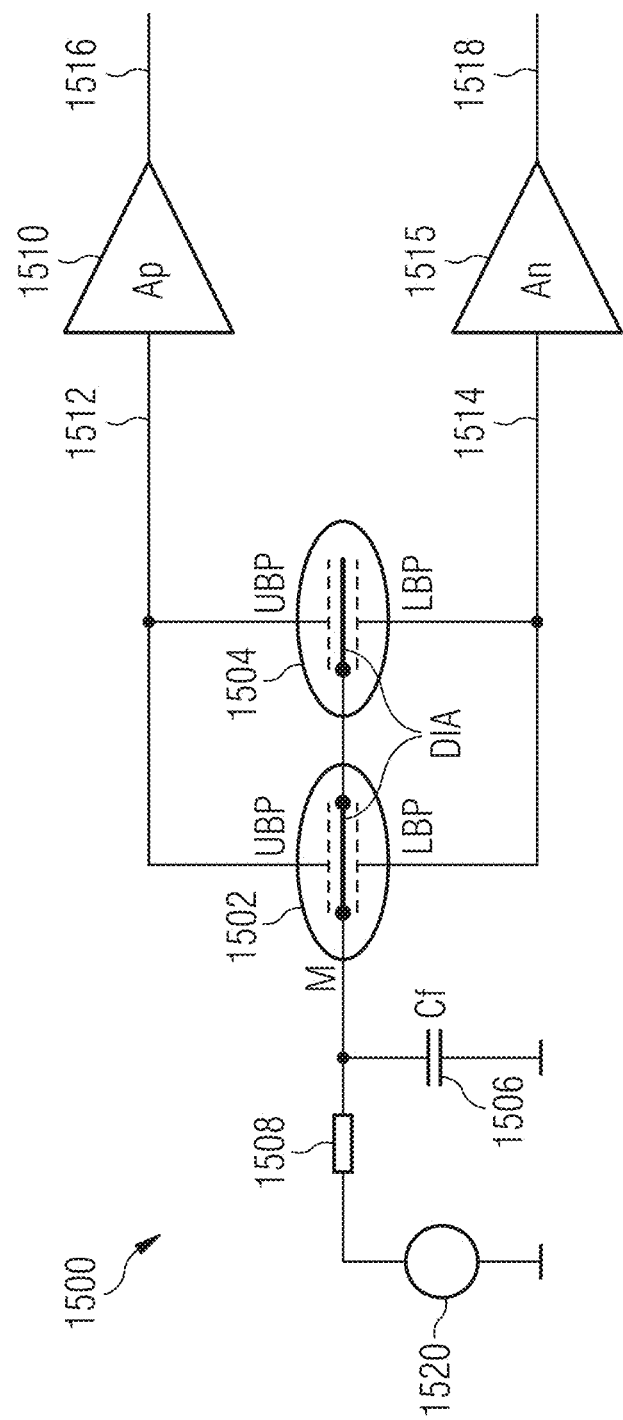
FIG. 15 illustrates a schematic of another embodiment dual backplate MEMS transducer system.

FIG. 15 illustrates a schematic of another embodiment dual backplate MEMS transducer system 1500 with two dual backplate MEMS microphones 1502 and 1504 coupled to two single-ended amplifiers 1510 and 1515 having gains Ap and An, respectively. According to various embodiments, Ap is equal in sign and magnitude to An. In other embodiments, Ap is opposites in sign and equal in magnitude to An.

Figure 16:
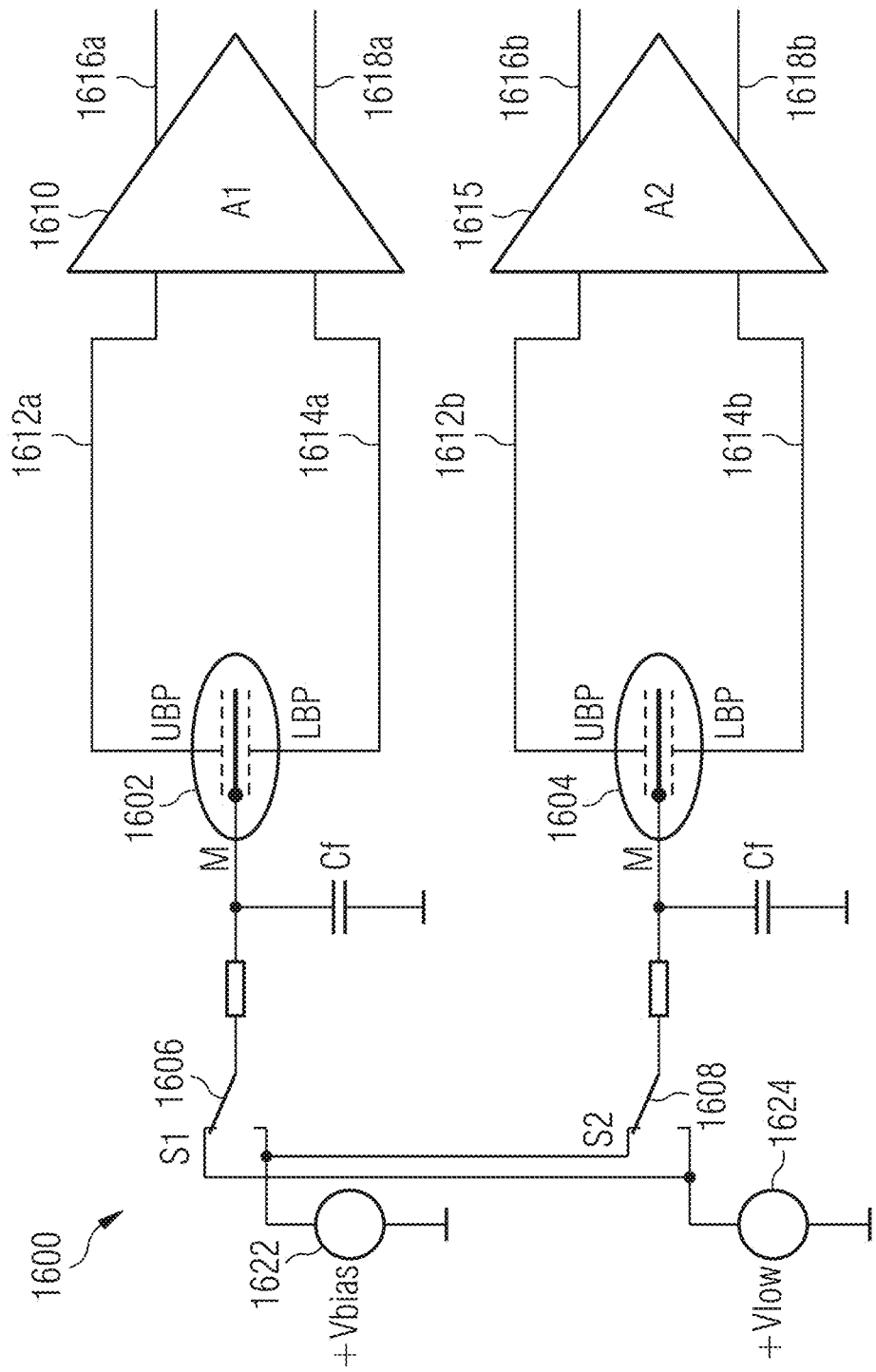
FIG. 16 illustrates a schematic of a further embodiment dual backplate MEMS transducer system.

FIG. 16 illustrates a schematic of a further embodiment dual backplate MEMS transducer system 1600 with two dual backplate MEMS microphones 1602 and 1604, two amplifiers 1610 and 1615, and two switches 1606 and 1608. In various embodiments, switches 1606 and 1608 turn on and off one or both MEMS microphones 1602 and 1604 by coupling and decoupling bias voltage generators 1622 and 1624. In other embodiments, bias voltage generators are configured to set the sensitivity of MEMS microphones 1602 and 1604. In a specific embodiment, bias generator 1622 provides higher sensitivity and higher power consumption and bias generator 1624 provides lower sensitivity and lower power consumption. In such an embodiment, switches 1606 and 1608 may be opened or closed according to system usage and demands to operate in a high sensitivity mode or a low power mode. According to various embodiments, amplifiers 1610 and 1615 may be differential amplifiers. In alternative embodiments, amplifiers 1610 and 1615 may be single ended amplifiers. In some embodiments, switches 1606 and 1608 are omitted and the different bias voltages are hard wired.

Figure 17:
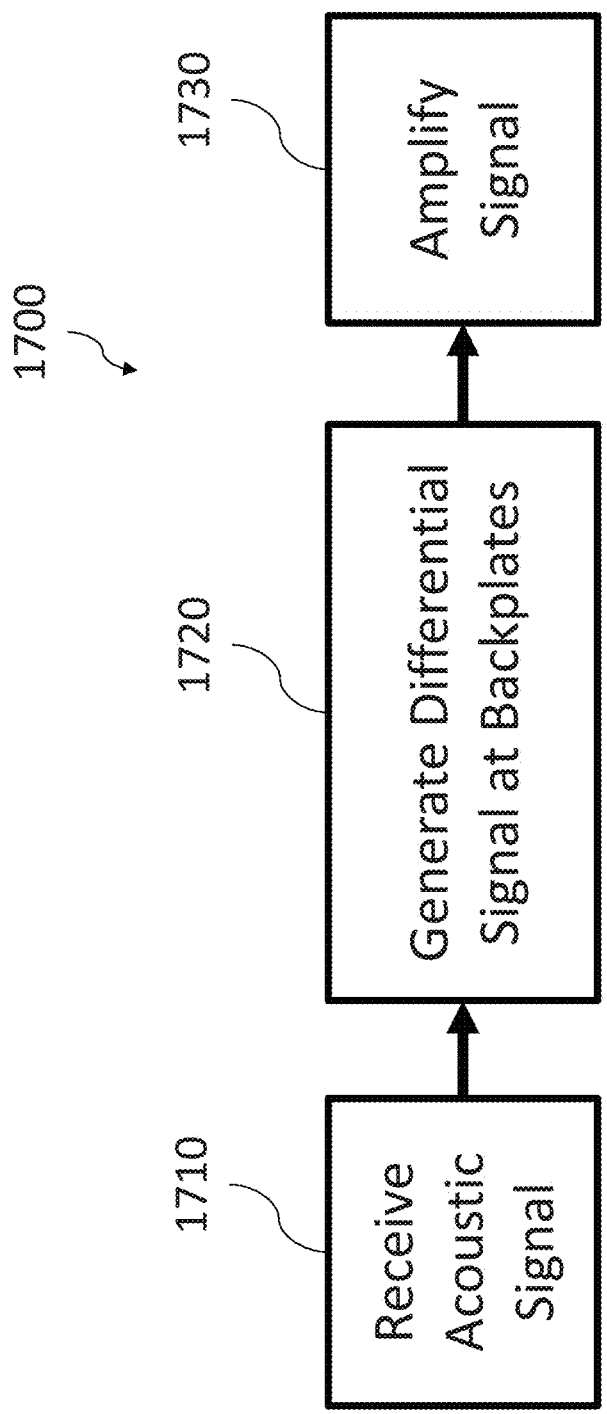
FIG. 17 illustrates a block diagram of an embodiment method of operating a transducer system.

FIG. 17 illustrates a block diagram of an embodiment method of operating a transducer system 1700 including steps 1710, 1720, and 1730. Step 1710 includes receiving an acoustic signal through a sound port acoustically coupled to a first and second transducer element. According to an embodiment, each transducer element includes a backplate and a diaphragm. Step 1720 includes generating a differential signal at the backplates of the transducer elements and step 1730 includes amplifying the differential signal.

Figure 18A:
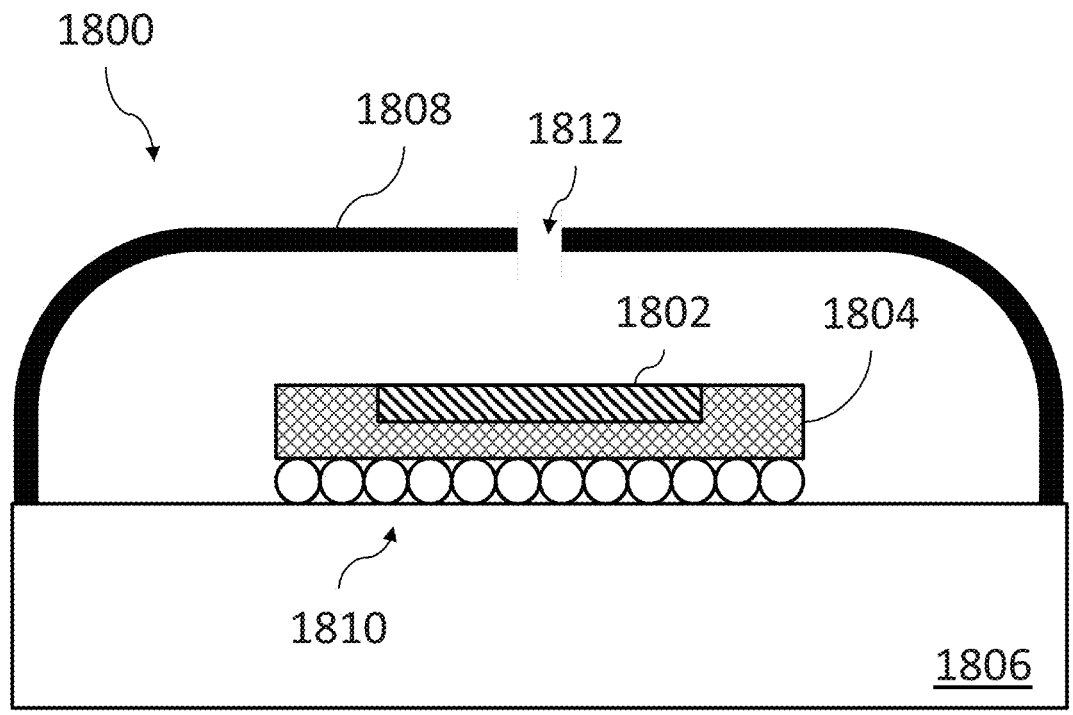
FIGS. 18a and 18b illustrate cross-sections of embodiment top-port microphone packages.

FIG. 18a illustrates a cross-section of an embodiment top-port microphone package 1800 including microphone 1802, integrated circuit (IC) 1804, package board 1806, and lid 1808. According to various embodiments, microphone 1802 is fabricated on a same IC 1804, and is located beneath sound port 1812. In other embodiments, the sound port may be located in other parts of the package and may or may not be above the microphone. IC 1804 may be attached to package board 1806 by a ball grid array (BGA) 1810. As illustrated, lid 1808 may be attached to package board 1806 and may include package sound port 1812.

In various embodiments, microphone 1802 is a MEMS microphone. Microphone 1802 may include multiple transducer elements, or may include multiple separate microphone chips, each having a single transducer or a plurality of transducers. In alternative embodiments, microphone 1802 may be fabricated on a separate IC and bonded to IC 1804 via an additional BGA, an electronic wafer level BGA (eWLB), or any method as known in the art. IC 1804 may be any integrated circuit, ASIC, FPGA, or similar chip.

Figure 18B:
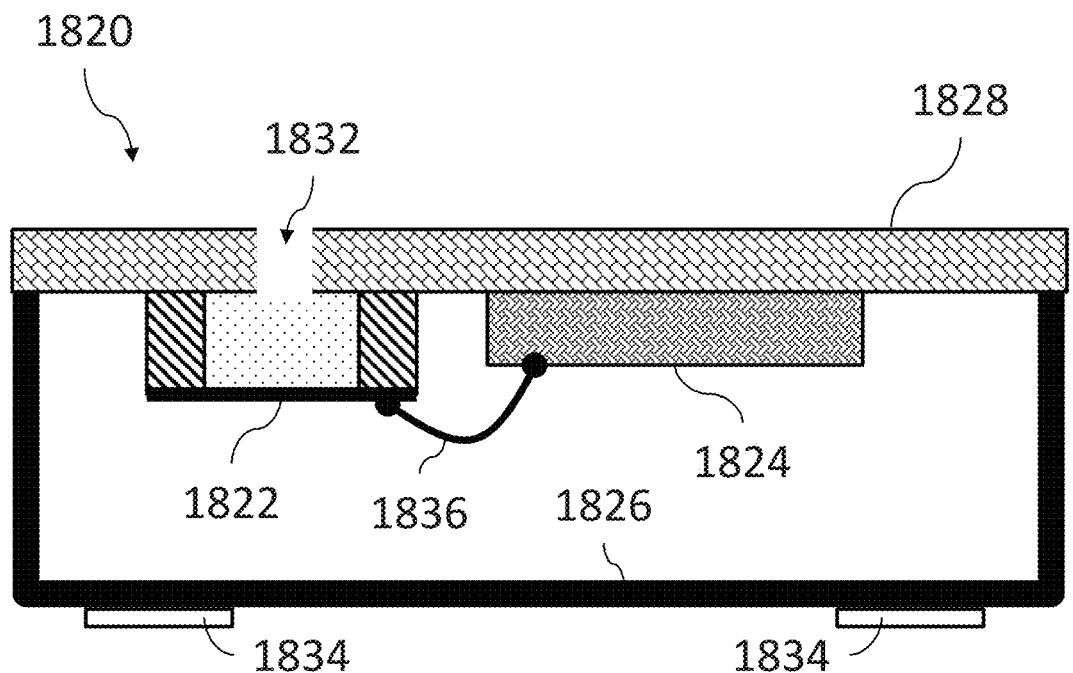

FIG. 18b illustrates a cross-section of another embodiment top-port microphone package 1820 including microphone 1822, integrated circuit (IC) 1824, package 1826, and lid 1828. According to various embodiments, microphone 1822 and IC 1824 are attached to lid 1828. Sound port 1832 is acoustically coupled to a cavity or a shared cavity of microphone 1822, as described in more detail above in reference to the other figures. Lid 1828 may be attached to package 1826, and package 1826 may include electrical connections 1834 for coupling to an electrical system, such as an embedded system in a cell phone package or on a PCB, for example. IC 1824 may be coupled to microphone 1822 via internal wiring 1836. Additional electrical connections may couple IC 1824 to electrical connections 1834. Such electrical connections may include traces in lid 1828 and package 1826, and/or additional internal wiring (not shown). In various embodiments, lid 1828 and package 1826 may include PCBs.

In various embodiments, microphones 1802 and 1822 may be implemented according to any of the embodiments described herein and, more particularly, according to FIGS. 8*a*-8*d*, 9, and 10, as described above. Accordingly, microphones 1802 and 1822 may include numerous transducer or MEMS transducer elements, substrates, spacers, and/or carrier chips. In alternative embodiments, microphones 1802 and 1822 are other types of MEMS transducers. In various embodiments, package board 1806, package 1826, lid 1808, and lid 1828 may be composed of PCBs, ceramic, polymer, glass, composite, metal, semiconductor, or any combination thereof.

An embodiment as described herein includes a microelectromechanical system (MEMS) with a first MEMS transducer element, a second MEMS transducer element, and a semiconductor substrate. The first and second MEMS transducer elements are disposed at a top surface of the semiconductor substrate and the semiconductor substrate includes a shared cavity acoustically coupled to the first and second MEMS transducer elements. A further embodiment includes a bias generator coupled to the first and second MEMS transducer elements and an amplifier with input terminals coupled to the first and second MEMS transducer elements. In such a case, the amplifier provides a differential output signal on its output terminals.

In various embodiments, the bias generator includes a first bias generator coupled to the first MEMS transducer element and configured to provide a first bias voltage and a second bias generator coupled to the second MEMS transducer element and configured to provide a second bias voltage. The amplifier and the bias generator may be disposed on an integrated circuit (IC) and may be electrically coupled to the first and second MEMS transducer elements. In some embodiments, the amplifier and the bias generator may be integrated on the substrate. The first MEMS transducer element may include a plurality of first MEMS transducer elements and the second MEMS transducer element may include a plurality of second MEMS transducer elements. In a further embodiment, the MEMS may also include a single sound port coupled to the shared cavity.

According to an embodiment, a MEMS includes a first MEMS transducer element disposed at a top surface of a first semiconductor substrate overlying a first cavity within the first semiconductor substrate, a second MEMS transducer element disposed at a top surface of a second semiconductor substrate overlying a second cavity within the second semiconductor substrate, a third substrate with a shared cavity, and a fourth substrate with a sound port. The first substrate and the second substrate may be disposed on the third substrate with at least a portion of the first cavity and a portion of the second cavity overlying the shared cavity. The third substrate may be different from the first semiconductor substrate and the second semiconductor substrate. Further, the third substrate may be disposed on the fourth substrate with at least a portion of the shared cavity overlying the sound port. The fourth substrate may be different from the first semiconductor substrate, the second semiconductor substrate, and the third substrate.

In various embodiments, the third substrate may include a carrier chip and the fourth substrate may include a printed circuit board (PCB). The shared cavity may be wider than the sound port. In some embodiments, the first substrate and the second substrate are a same substrate. The MEMS may also include a bias generator coupled to the first and second MEMS transducer elements and an amplifier. The amplifier may have input terminals coupled to the first and second MEMS transducer elements and output terminals configured to provide a differential output signal. In further embodiments, the first MEMS transducer element includes a plurality of first MEMS transducer elements and the second MEMS transducer element includes a plurality of second MEMS transducer elements.

According to an embodiment, a method of operating an acoustic transducer system includes receiving an acoustic signal via a shared sound port using a first transducer element and a second transducer element, generating a first differential signal at outputs of the first and second transducer elements, and amplifying the first differential signal with an amplifier. Further, the method may include generating a second differential signal at an output of the amplifier. In some embodiments, receiving the acoustic signal includes receiving the acoustic signal through a single cavity formed in a substrate and acoustically coupled to the shared sound port. In such an embodiment, the first and second transducer elements are formed on the substrate over the cavity. In further embodiments, generating the first differential signal at the first and second transducer elements includes generating a first signal from the first transducer element and generating a second signal from the second transducer element. The second signal may be antiphase to the first signal.

According to an embodiment, a method of fabricating a transducer system includes: (1) forming a first MEMS microphone and a second MEMS microphone on a top surface of a semiconductor substrate, (2) applying a first etch mask on a bottom surface of the semiconductor substrate, (3) applying a second etch mask on a bottom surface of the semiconductor substrate, etching a portion of the semiconductor substrate according to the second mask from the bottom surface of the semiconductor substrate and stopping the etching before bottom sides of the first and second MEMS microphones are exposed, and (4) removing the second mask and etching a portion of the semiconductor substrate according to the first etch mask until the bottom sides of the first and second MEMS microphones are exposed. The first etch mask includes a first opening aligned with the MEMS microphones and the second etch mask includes second and third openings aligned with and corresponding to the first MEMS microphone and the second MEMS microphone.

According to an embodiment, a transducer system includes a first mechanically rigid backplate, a first deflectable diaphragm adjacent to the first backplate and configured to be electrically coupled to a first bias voltage, a second mechanically rigid backplate, a second deflectable diaphragm adjacent to the second backplate and configured to be electrically coupled to a second bias voltage, and an amplifier having input terminals electrically coupled to the first and second mechanically rigid backplates. In some embodiments, the amplifier has output terminals configured to provide a differential output signal. The amplifier may be a differential amplifier.

In various embodiments, the transducer system also includes a bias voltage generator configured to generate the first bias voltage and the second bias voltage. The first bias voltage may be different from the second bias voltage. Further, the amplifier and the bias voltage generator may be disposed on an integrated circuit (IC). In an embodiment, the first mechanically rigid backplate and the first deflectable diaphragm include a plurality of first mechanically rigid backplates and a plurality of first deflectable diaphragms, and the second mechanically rigid backplate and the second deflectable diaphragm include a plurality of second mechanically rigid backplates and a plurality of second deflectable diaphragms.

In various embodiments, the first and second mechanically rigid backplates are a double backplate MEMS microphone and the first and second deflectable diaphragms are a single diaphragm of the double backplate MEMS microphone. In another embodiment, the amplifier includes a first single ended amplifier and a second single ended amplifier. The first single ended amplifier may have a first gain of a substantially equal magnitude and opposite sign as a second gain of the second single ended amplifier.

According to an embodiment, a MEMS includes a printed circuit board (PCB) with a first cavity disposed above a second cavity and a MEMS transducer disposed at a top surface of the PCB adjacent the first cavity. The first cavity may be larger than the second cavity. Further, the MEMS transducer includes a semiconductor substrate, a first MEMS transducer element disposed at a top surface of the semiconductor substrate overlying a third cavity formed in the semiconductor substrate, and a second MEMS transducer element disposed at the top surface of the semiconductor substrate overlying a fourth cavity formed in the semiconductor substrate. In such an embodiment, the first, second, third, and fourth cavities are all acoustically coupled. In various embodiments, the PCB includes a first layer including the first cavity and a second layer including the second cavity. The first and second MEMS transducer elements may together include or form a double backplate MEMS microphone.

Advantages of embodiments described herein may include robust performance in the presence of interference, linear transducer operation with low $2^{nd}$ order distortion, a large signal swing for a given supply voltage with a high dynamic range, and good performance under high sound pressure level (SPL) conditions. Embodiments having a dual backplate MEMS may facilitate using a topologically simple ASIC and a high space usage efficiency. Multiple single backplate MEMS may have low manufacturing costs, low acoustic noise, and be physically robust.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transducer system comprising:
    a first mechanically rigid backplate;
    a first deflectable diaphragm adjacent to the first backplate and configured to be electrically coupled to a first bias voltage;
    a second mechanically rigid backplate;
    a second deflectable diaphragm adjacent to the second backplate and configured to be electrically coupled to a second bias voltage;
    an amplifier having input terminals electrically coupled to the first and second mechanically rigid backplates,
    a first switch comprising inputs coupled to the first and second bias voltages;
    a second switch comprising inputs coupled to the first and second bias voltages;
    a first filter directly coupled between an output of the first switch and the first deflectable diaphragm; and
    a second filter directly coupled between an output of the second switch and the second deflectable diaphragm.

2. The transducer system of claim 1, wherein the amplifier has output terminals configured to provide a differential output signal.

3. The transducer system of claim 2, wherein the amplifier comprises a differential amplifier.

4. The transducer system of claim 1, further comprising a bias voltage generator configured to generate the first bias voltage and the second bias voltage.

5. The transducer system of claim 4, wherein the first bias voltage is different from the second bias voltage.

6. The transducer system of claim 4, wherein the amplifier and the bias voltage generator are disposed on an integrated circuit (IC).

7. The transducer system of claim 1, wherein the first mechanically rigid backplate and the first deflectable diaphragm comprise a plurality of first mechanically rigid backplates and a plurality of first deflectable diaphragms, and wherein the second mechanically rigid backplate and the second deflectable diaphragm comprise a plurality of second mechanically rigid backplates and a plurality of second deflectable diaphragms.

8. The transducer system of claim 1, wherein the first and second mechanically rigid backplates comprise a double backplate microelectromechanical system (MEMS) microphone, and wherein the first and second deflectable diaphragms comprise a single diaphragm of the double backplate MEMS microphone.

9. The transducer system of claim 1, wherein the amplifier comprises a first single ended amplifier and a second single ended amplifier, wherein the first single ended amplifier has a first gain of a substantially equal magnitude and opposite sign as a second gain of the second single ended amplifier.

10. A microelectromechanical system (MEMS) comprising:
    a board comprising a first circular cavity disposed above a second circular cavity, the first cavity being larger than the second cavity; and
    a MEMS transducer disposed at a top surface of the board adjacent the first cavity, the MEMS transducer comprising:
        a semiconductor substrate,
        a first MEMS transducer element disposed at a top surface of the semiconductor substrate overlying a third cavity formed in the semiconductor substrate, and
        a second MEMS transducer element disposed at the top surface of the semiconductor substrate overlying a fourth cavity formed in the semiconductor substrate, wherein the first, second, third, and fourth cavities are all acoustically coupled;
    a first switch comprising inputs coupled to first and second bias voltages;
    a second switch comprising inputs coupled to the first and second bias voltages;
    a first filter directly coupled between an output of the first switch and a deflectable diaphragm of the first MEMS transducer element; and a second filter directly coupled between an output of the second switch and a deflectable diaphragm of the second transducer element.

11. The MEMS of claim 10, wherein the board comprises a first layer comprising the first cavity and a second layer comprising the second cavity.

12. The MEMS of claim 10, wherein the first and second MEMS transducer elements comprise a double backplate MEMS microphone.

13. The MEMS of claim 10, wherein the first cavity is wider than the second cavity.

14. The MEMS of claim 10, wherein the board comprises a printed circuit board (PCB).

15. The MEMS of claim 10, wherein the board comprises a ceramic substrate.

16. A MEMS transducer system comprising:
a first dual backplate MEMS microphone;
a second dual backplate MEMS microphone;
a first amplifier coupled to the first dual backplate MEMS microphone;
a second amplifier coupled to the second dual backplate MEMS microphone;
a first bias voltage generator configured for selective coupling a first bias voltage to the first dual backplate MEMS microphone or the second dual backplate MEMS microphone;
a second bias voltage generator configured for selective coupling a second bias voltage to the first dual backplate MEMS microphone or the second dual backplate MEMS microphone,
wherein the first bias voltage is different from the second bias voltage;
a first switch comprising inputs coupled to the first and second bias voltage generators, and an output coupled to the first dual backplate MEMS microphone;
a second switch comprising inputs coupled to the first and second bias voltage generators, and an output coupled to the second dual backplate MEMS microphone;
a first filter interposed between the output of the first switch and the first dual backplate MEMS microphone; and
a second filter interposed between the output of the second switch and the second dual backplate MEMS microphone,
wherein an output of the first filter is directly connected to a membrane of the first dual backplate MEMS microphone, and an output of the second filter is directly connected to a membrane of the dual backplate MEMS microphone.

17. The MEMS transducer system of claim 16, wherein the first amplifier and the second amplifier comprise differential amplifiers.

18. The MEMS transducer system of claim 16, wherein the first amplifier and the second amplifier comprise single-ended amplifiers.

* * * * *